(12) United States Patent
Tonami

(10) Patent No.: US 12,135,311 B2
(45) Date of Patent: Nov. 5, 2024

(54) WIRE ROPE INSPECTION METHOD, WIRE ROPE INSPECTION SYSTEM, AND WIRE ROPE INSPECTION DEVICE

(71) Applicant: Shimadzu Corporation, Kyoto (JP)

(72) Inventor: Hiromichi Tonami, Kyoto (JP)

(73) Assignee: SHIMADZU CORPORATION, Kyoto (JP)

( * ) Notice: Subject to any disclaimer, the term of this patent is extended or adjusted under 35 U.S.C. 154(b) by 106 days.

(21) Appl. No.: 17/861,647

(22) Filed: Jul. 11, 2022

(65) Prior Publication Data
US 2023/0072626 A1 Mar. 9, 2023

(30) Foreign Application Priority Data
Sep. 3, 2021 (JP) .................. 2021-144274

(51) Int. Cl.
*G01N 27/83* (2006.01)
*G01N 27/82* (2006.01)
*G01R 33/02* (2006.01)

(52) U.S. Cl.
CPC ............ *G01N 27/83* (2013.01); *G01N 27/82* (2013.01); *G01R 33/02* (2013.01)

(58) Field of Classification Search
CPC ......... G01N 27/83; G01N 27/82; G01R 33/02
USPC ........................................................ 324/200
See application file for complete search history.

(56) References Cited

U.S. PATENT DOCUMENTS

| | | | |
|---|---|---|---|
| 2019/0360965 A1 | 11/2019 | Iijima | |
| 2021/0215639 A1 | 7/2021 | Iijima | |
| 2021/0380372 A1* | 12/2021 | Iijima | G01N 27/87 |
| 2021/0382008 A1* | 12/2021 | Kodama | G01N 27/82 |
| 2022/0196599 A1* | 6/2022 | Iijima | G01N 27/82 |
| 2023/0273155 A1* | 8/2023 | Takami | G01N 27/82 |
| | | | 324/228 |

FOREIGN PATENT DOCUMENTS

| | | |
|---|---|---|
| WO | 2018138850 A1 | 8/2018 |
| WO | 2019150539 A1 | 8/2019 |
| WO | 2019220953 A1 | 11/2019 |

* cited by examiner

*Primary Examiner* — Raul J Rios Russo
(74) *Attorney, Agent, or Firm* — Muir Patent Law, PLLC

(57) ABSTRACT

A wire rope inspection method performs second differential processing on a positive component or a negative component of a first-order differential waveform. Then, the positive component of the second-order differential waveform and an absolute value of the negative component of the second-order differential waveform are added in a state in which portions of the second-order differential waveform indicating the abnormal portion of the wire rope are shifted to overlap with each other. Then, the abnormal portion of the wire rope is determined based on the generated composite waveform.

10 Claims, 17 Drawing Sheets

WIRE ROPE INSPECTION METHOD, WIRE ROPE INSPECTION SYSTEM, AND WIRE ROPE INSPECTION DEVICE

CROSS-REFERENCE TO RELATED APPLICATIONS

The related application number JP2021-144274, entitled "Wire Rope Inspection Method, Wire Rope Inspection System, and Wire Rope Inspection Device," filed on Sep. 3, 2021, invented by Hiromichi TONAMI, upon which this patent application is based, is hereby incorporated by reference.

BACKGROUND OF THE INVENTION

The present invention relates to a wire rope inspection method, a wire rope inspection system, and a wire rope inspection device.

DESCRIPTION OF THE BACKGROUND ART

Conventionally, an inspection device for detecting a change in a magnetic flux of a steel wire rope is known. Such a device is disclosed, for example, in International Publication No. WO 2018/138850.

The inspection device described in International Publication No. WO 2018/138850 is provided with a detection coil for detecting a change in a magnetic field of a wire rope. This detection coil is configured by a differential coil composed of two coils. The detection signal by the differential coil is approximately zero at a non-damaged portion and is greater than zero at a damaged portion. The inspection device described in International Publication No. WO 2018/138850 determines, for example, damage of a wire rope, based on the magnitude of the detection signal from the detection coil.

Although not described in the above-described International Publication No. WO 2018/138850, in the case of determining abnormality of a wire rope based on a magnetic flux of the wire rope detected by the detection coil (detection unit), the magnetic flux (magnetic characteristic) detected due to the shape, etc., of the wire rope is not constant and has a specific change in the magnetic characteristic. This specific change in the magnetic characteristic is included as noise in the detection signal from the detection unit. The small difference between the noise signal and the signal indicating the abnormal portion reduces the accuracy of detecting the abnormal portion of the wire rope. Therefore, it has been desired to accurately determine the abnormal portion of the wire rope by distinguishing between the noise inherent in the wire rope and the signal indicating the abnormal portion of the wire rope.

SUMMARY OF THE INVENTION

The present invention has been made to solve the above-described problems. One object of the present invention is to provide a wire rope inspection method, a wire rope inspection system, and a wire rope inspection device each capable of accurately determining an abnormal portion of a wire rope by distinguishing between noise inherent in a wire rope and a signal indicating the abnormal portion.

In order to achieve the above-described objects, a wire rope inspection method according to a first aspect of the present invention includes the steps of:

applying a magnetic field to a wire rope that is an inspection target;

acquiring a detection signal by detecting a change in a magnetic flux of the wire rope to which the magnetic field has been applied, while relatively moving with respect to the wire rope;

acquiring a first-order differential waveform by performing first differential processing on a magnetic flux waveform that is a signal waveform based on the acquired detection signal;

acquiring a second-order differential waveform by performing second differential processing on a positive component or a negative component of the acquired first-order differential waveform;

generating a composite waveform by adding the positive component of the acquired second-order differential waveform and an absolute value of the negative component of the acquired second-order differential waveform in a state in which portions indicating an abnormal portion of the wire rope are shifted along a time axis to overlap with each other; and determining the abnormal portion of the wire rope in a case where a value based on the generated composite waveform is greater than a predetermined determination threshold.

Note that the term "abnormal portion" in a wire rope refers to a broad concept that includes a portion where a change in a cross-sectional area or a change in a composition of a wire rope, due to, e.g., a wire disconnection, a kink, rust, and adhesion of a foreign matter, has occurred, The wire rope inspection system according to a second aspect of the present invention, includes:

a wire rope inspection device configured to detect a change in a magnetic flux of a wire rope that is an inspection target; and a processing device configured to perform processing for determining an abnormal portion of the wire rope based on a measurement result of the wire rope by the wire rope inspection device, wherein the wire rope inspection device includes an excitation unit configured to apply a magnetic flux to the wire rope and a detection unit configured to acquire a direction signal by detecting the change in the magnetic flux of the wire rope to which a magnetic field has been applied, while relatively moving with respect to the wire rope, wherein the processing device includes:

a first differential processing unit configured to acquire a first-order differential waveform by performing first differential processing on a magnetic flux waveform that is a signal waveform based on the detection signal acquired by the detection unit;

a second differential processing unit configured to acquire a second-order differential waveform by performing second differential processing on a positive component or a negative component of the first-order differential waveform acquired by the first differential processing unit;

an addition processing unit configured to generate a composite waveform by adding a positive component of the second-order differential waveform acquired by the second differential processing unit and an absolute value of a negative component of the second-order differential waveform acquired by the second differential processing unit in a state in which portions of the second-order differential waveform indicating the abnormal portion of the wire rope are shifted along a time axis to overlap with each other; and a determination processing unit configured to determine the abnormal portion of the wire rope in a case where a value based on the composite waveform generated by the addition processing unit is greater than a predetermined determination threshold.

The wire rope inspection device according to a third aspect of the present invention, includes:

an excitation unit configured to apply a magnetic field to a wire rope that is an inspection target;

a detection unit configured to acquire a detection signal by detecting a change in a magnetic flux of the wire rope to which a magnetic field has been applied by the excitation unit, while relatively moving with respect to the wire rope; and a processing unit configured to perform processing for determining an abnormal portion of the wire rope based on the detection signal acquired by the detection unit, wherein the processing unit includes:

a first differential processing unit configured to acquire a first-order differential waveform by performing first differential processing on a magnetic flux waveform that is a signal waveform based on the detection signal acquired by the detection unit;

a second differential processing unit configured to acquire a second-order differential waveform by performing second differential processing on a positive component or a negative component of the first-order differential waveform acquired by the first differential processing unit;

an addition processing unit configured to generate a composite waveform by adding a positive component of the second-order differential waveform acquired by the second differential processing unit and an absolute value of a negative component of the second-order differential waveform acquired by the second differential processing unit in a state in which portions of the second-order differential waveform indicating the abnormal portion of the wire rope are shifted along a time axis to overlap with each other; and a determination processing unit configured to determine the abnormal portion of the wire rope in a case where a value based on the composite waveform generated by the addition processing unit is greater than a predetermined determination threshold.

In the wire rope inspection method according to the first aspect of the present invention, the wire rope inspection system according to the second aspect of the present invention, and the wire rope inspection device according to the third aspect of the present invention, as described above, first differential processing is performed on a magnetic flux waveform that is a signal waveform based on the acquired detection signal waveform to thereby acquire a first-order differential waveform. Then, second differential processing is performed on the positive component or the negative component of the acquired first-order differential waveform to thereby acquire a second-order differential waveform.

A shape of a portion of a magnetic waveform corresponding to an abnormal portion of a wire rope has a positively sloped shape or a negatively sloped shape depending on the type of the abnormal portion (wire disconnection, a kink, rust, adhesion of a foreign matter, or the like). Therefore, a portion of a first-order differential waveform corresponding to an abnormal portion is included in either the positive component or the negative component of the first-order differential waveform, depending on the type of the abnormal portion. For example, in a case where the abnormal portion of the wire rope is a wire disconnection portion, the shape of the portion of the first-order differential waveform corresponding to the abnormal portion has a positively sloped shape. Therefore, in a case where the abnormal portion is a wire disconnection portion, the waveform of the portion of the first-order differential waveform corresponding to the abnormal portion is included in the positive component of the first-order differential waveform.

On the other hand, in the present invention, second differential processing is performed on the positive component or the negative component of the acquired first-order differential waveform to acquire a second-order differential waveform. Thus, second differential processing can only be performed on the positive component or the negative component extracted so as to correspond to the type of the abnormal portion. Therefore, the second differential processing can be performed in a state in which the waveforms that do not contain an abnormal portion but contain only noise are canceled.

In the present invention, as described above, the positive component of the acquired second-order differential waveform and the absolute value of the negative component of the acquired second-order differential waveform are added in a state in which portions of the second-order differential waveform indicating the abnormal portion of the wire rope are shifted to overlap with each other, to generate a composite waveform.

With this, based on the second-order differential waveform acquired in a state in which the waveforms of the components of the second-order differential waveform that do not include abnormal portions but only include noise are removed, the positive component and the absolute value of the negative component of the second-order differential waveform are added such that the portions of the second-order differential waveform indicating the abnormal portion of the wire rope overlap with each other, to generate the composite waveform.

For this reason, it is possible to generate a composite waveform such that the portion of the second-order differential waveform corresponding to the abnormal portion has a larger peak so that it is more conspicuous than the noise other than the abnormal portion. Therefore, by determining the peak of the composite waveform, it is possible to distinguish between the noise inherent in the wire rope and the abnormal portion of the wire rope. Consequently, it is possible to accurately determine the abnormal portion of the wire rope by distinguishing between the noise inherent in the wire rope and the signal indicating the abnormal portion of the wire rope.

DESCRIPTION OF THE PREFERRED EMBODIMENTS

Hereinafter, some embodiments in which the present invention is embodied will be described with reference to the attached drawings.

First Embodiment

First, with reference to FIGS. 1 to 12, a configuration of a wire rope inspection system 100 according to a first embodiment of the present invention will be described. In the following description, note that the term "perpendicular" means intersecting at an angle of 90 degrees or nearly 90 degrees. Further note that the term "parallel" means parallel and substantially parallel.

(Configuration of Wire Rope Inspection System)

Figure 1:
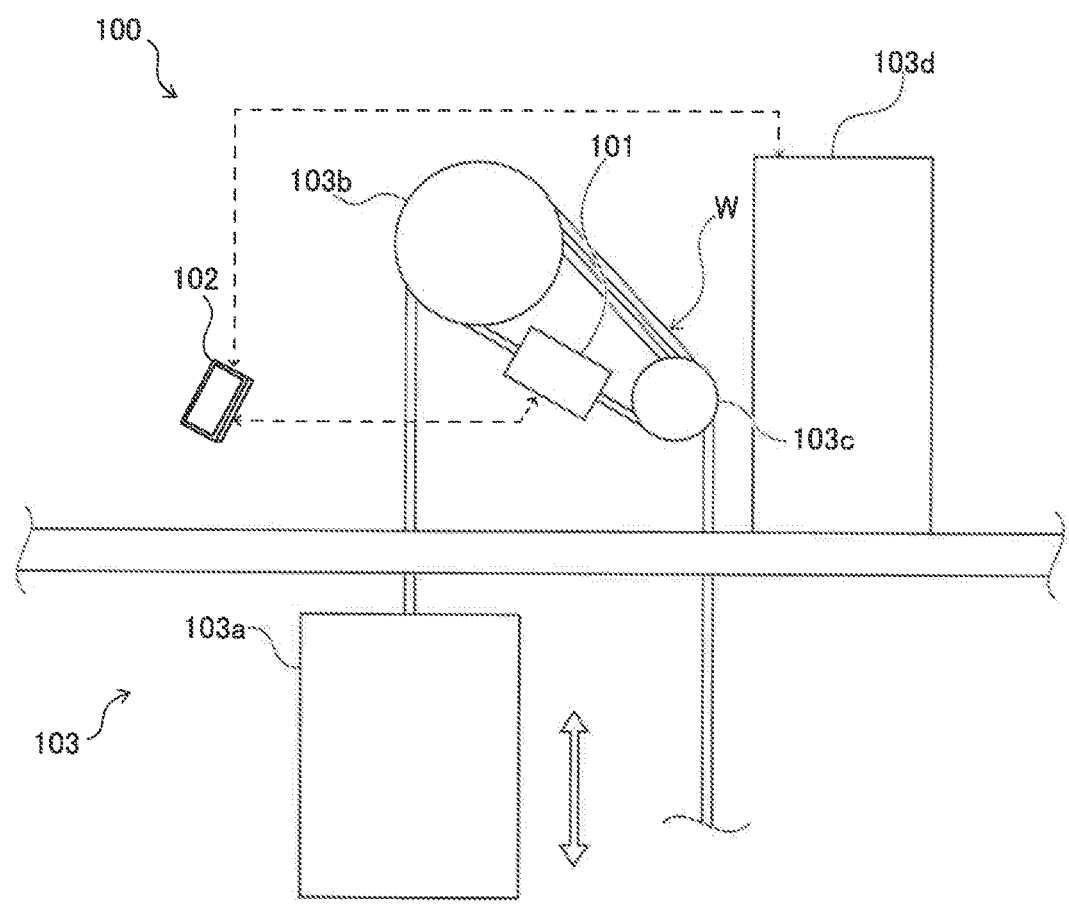
FIG. 1 is a schematic diagram showing an entire configuration of a wire rope inspection system according to a first embodiment.

As shown in FIG. 1, the wire rope inspection system 100 is provided with a wire rope inspection device 101 and a processing device 102. The wire rope inspection device 101 detects a change in a magnetic flux of a wire rope W, which is an inspection target. The wire rope inspection device 101 is configured to transmit the measurement result measured by detecting the change in the magnetic flux of the wire rope W to the processing device 102.

The processing device 102 performs processing for determining the abnormal portion of the wire rope W based on the measurement result of the wire rope W by the wire rope inspection device 101. Further, the processing device 102 performs the display of the determination result of the wire rope W, the measurement result of the abnormal portion, and the like, by the wire rope inspection device 101.

The wire rope inspection system 100 performs the inspection of the wire rope W provided on the elevator 103. Specifically, the wire rope inspection system 100 is a system for inspecting abnormal portions (wire disconnection, etc.) of the wire rope W of the elevator 103, which is an inspection target. Further, the wire rope inspection system 100 is a system capable of confirming abnormalities of the wire rope W that are difficult to visually confirm, by a total magnetic flux method that measures the magnetic flux inside the wire rope W.

In a case where the wire rope W includes an abnormal portion, the magnetic flux at the abnormal portion differs from the magnetic flux at the normal portion. The total magnetic flux method is a method that can also measure the internal abnormal portion of the wire rope W, unlike a method in which only a leakage magnetic flux is measured from an abnormal portion, etc., on a surface of a wire rope W.

(Configuration of Elevator)

As shown in FIG. 1, the elevator 103 is provided with a cage 103a, a sheave 103b, a sheave 103c, a control device 103d, and a wire rope W.

The elevator 103 is configured to vertically move the cage 103a loading people, loads and the like by rotating the sheave 103b (pulley) provided to the winding machine to wind up the wire rope W. The elevator 103 is, for example, a double-wrap (full-wrap) rope-type elevator provided with two sheaves, i.e., the sheave 103b and the sheave 103c. The double-wrap method employs a structure in which the wire rope W guided from the sheave 103b of the winding machine to the sheave 103c, which is served as a deflector wheel, is returned to the sheave 103b of the winding machine to thereby put the wire rope W on the sheave 103b twice.

The control device 103d includes a control board for controlling the operation of each part of the elevator 103. Further, the control device 103d includes a radio communication module and the like and is configured to be able to communicate with the processing device 102.

The wire rope W is formed by braiding (e.g., strand-braiding) magnetic wire materials and is a magnetic body of an elongated member. The wire rope W is inspected for the state (the presence or absence of abnormal portions) by the wire rope inspection device 101 in order to prevent the occurrence of wire disconnection due to deterioration in advance. As a result of the measurement of the magnetic flux of the wire rope W, the wire rope W determined that the degree of degradation has exceeded a predetermined criterion will be replaced by the inspection operator.

Note that in the example shown in FIG. 1, for convenience, although only one wire rope W is illustrated, the elevator 103 is provided with a plurality of wire ropes W. For example, the elevator 103 is provided with four wire ropes W.

The wire rope W is arranged to extend in the X-direction (see FIG. 3) at the position of the wire rope inspection device 101. The wire rope inspection device 101 measures the magnetic flux of the wire rope W while moving in the extending direction (X-direction) relative to the wire rope W along the surface of the wire rope W.

Like the wire rope W used for the elevator 103, in a case where the wire rope W itself moves, the measurement of the magnetic flux of the wire rope W by the wire rope inspection device 101 is performed while moving the wire rope W in the X2-direction. With this, the wire rope inspection device 101 inspects the damage at each position of the wire rope W in the X-direction by measuring the magnetic flux at each position of the wire rope W in the X-direction.

(Configuration of Wire Rope Inspection Device)

Figure 2:
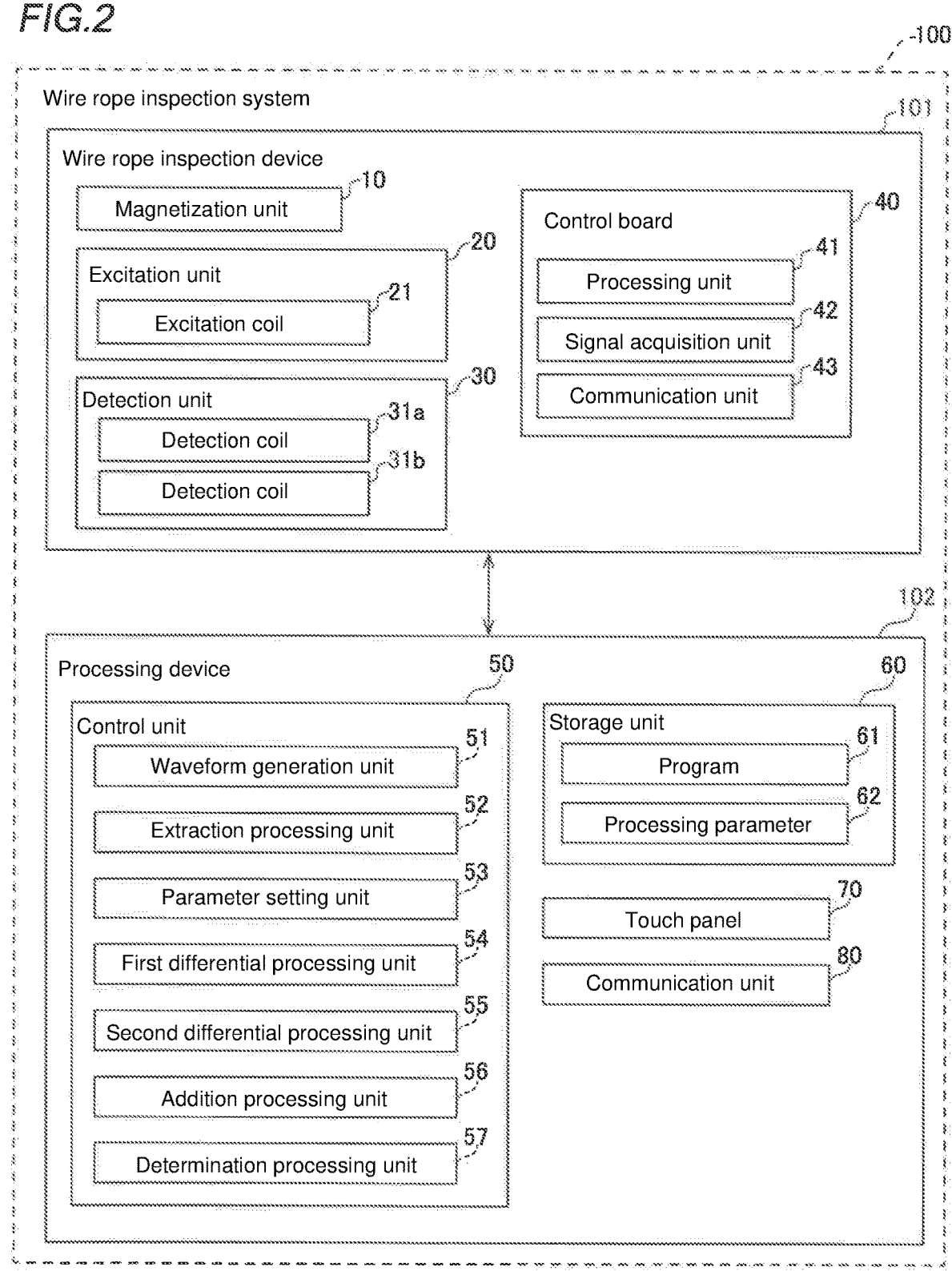
FIG. 2 is a block diagram showing an entire configuration of a wire rope inspection system according to a first embodiment.
Figure 3:
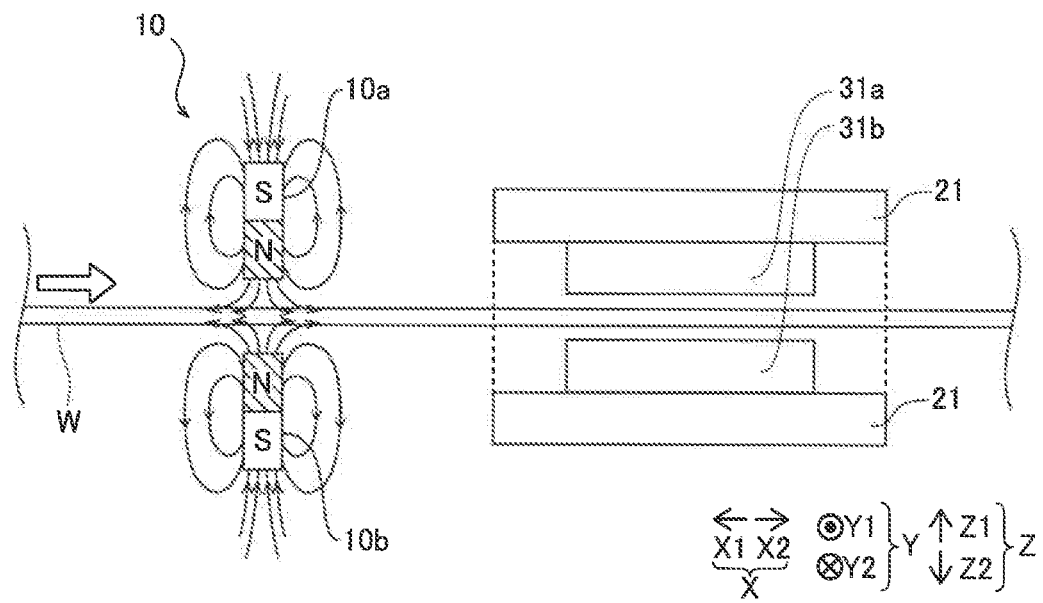
FIG. 3 is a diagram showing an arrangement of a magnetization unit, an excitation unit, and a detection unit of a wire rope inspection device according to a first embodiment.

As shown in FIGS. 2 and 3, the wire rope inspection device 101 is provided with a magnetization unit 10, an excitation unit 20, a detection unit 30, and a control board 40. The wire rope inspection device 101 is arranged between the sheave 103b and the sheave 103c of the elevator 103 to inspect the wire rope W.

The magnetization unit 10 aligns the magnetization direction of the wire rope W by applying a magnetic field in advance to the wire rope W. For example, the magnetization unit 10 is composed of permanent magnets. Further, the magnetization unit 10 includes a pair of a magnetization portion 10a and a magnetization portion 10b. The pair of magnetization portions 10a and 10b are arranged on both sides of the lateral direction of the wire rope W (the direction perpendicular to the extending direction of the wire rope W, i.e., the Z-direction) so as to sandwich the wire rope W.

Specifically, the magnetization portion 10a is arranged on the Z1-direction side of the wire rope W. The magnetization portion 10b is arranged on the Z2-direction side of the wire rope W. In the magnetization unit 10, the N-pole (illustrated with diagonal lines) of the magnetization portion 10a oriented in the Z2-direction and the N-pole (illustrated with diagonal lines) of the magnetization portion 10b oriented in the Z1-direction are provided so as to face each other across the wire rope W. The magnetization portions 10a and 10b are configured to be able to apply a relatively strong magnetic field to substantially uniformly align the orientation of the magnetization of the wire rope W.

The excitation unit 20 is configured to apply a magnetic field (magnetic flux) to the wire rope W to excite (vibrate) the magnetization state of the wire rope W. Specifically, the excitation unit 20 includes an excitation coil 21. The excitation coil 21 is provided to collectively wind around all of the plurality (four) wire ropes W along the extending direction (X-direction) of the wire rope W. Further, the excitation coil 21 is provided to wind around the outside of the detection coils 31a and 31b of the detection unit 30, which will be described later, with respect to the wire rope W.

The excitation coil 21 generates a magnetic flux (magnetic field) inside the coil (the inner side of the ring of the coil) along the extending direction (X-direction) of the wire rope W by flowing the exciting AC current. Specifically, an alternating current (excitation current) having a constant magnitude and a constant frequency is caused to flow through the excitation unit 20 (excitation coil 21) under the control of the processing unit 41 of the control board 40, which will be described later, to thereby apply a magnetic field (magnetic flux) so as to oscillate in the extending direction (X-direction) of the wire rope W. That is, in the wire rope W, the magnetic field (magnetic flux) which has been aligned in advance by the magnetization unit 10 oscillates such that the magnetic field in the X1-direction and the magnetic field in the X2-direction appear periodically by the excitation unit 20.

The detection unit 30 is configured to acquire a detection signal by detecting the change in the magnetic flux of the wire rope W to which a magnetic field is applied (excited) to be oscillated by the excitation unit 20 after the magnetic field has been applied in advance by the magnetization unit 10 (after the magnetization has been aligned), while moving relative to the wire rope W. In the wire rope inspection system 100 according to the first embodiment, the detection unit 30 detects the change in the magnetic flux of the wire rope W while moving relative to the wire rope W by detecting the change in the magnetic flux of the wire rope W moving in the X2-direction.

Specifically, the detection unit 30 includes a detection coil 31a to be arranged on one side (Z1-direction side) of the direction (Z-direction) perpendicular to the extending direction (X-direction) of the wire rope W and a detection coil 31b arranged on the other side (Z2-direction side). Further, the detection coils 31a and 31b are arranged to sandwich the wire rope W in a state of sandwiching a single wire rope W by two coils. Note that the detection coils 31a and 31b are provided for each of the plurality of (four) wire ropes W.

Figure 4:
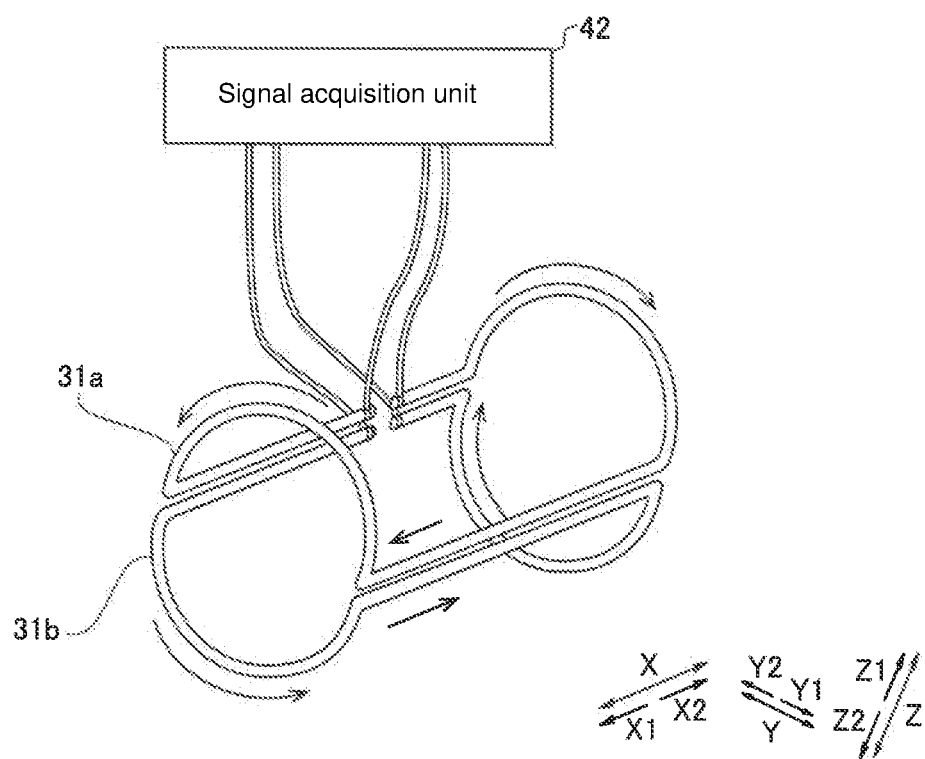
FIG. 4 is a schematic diagram for explaining a configuration of a detection coil of a detection unit.

As shown in FIG. 4, the detection coils 31a and 31b are provided so as to wind around the wire rope W along the extending direction of the wire rope W. Specifically, the detection coil 31a and the detection coil 31b each are an independent straddle-type coil (saddle-type coil). Each of the detection coil 31a and the detection coil 31b is arranged so as to cover the half circumference of the wire rope W.

Therefore, the detection coils 31a and 31b are provided so as to wind around the entire circumference of the wire rope W by two straddle-type coils along the extending direction (X-direction) of the wire rope W by combining the detection coil 31a and the detection coil 31b. Further, the detection coils 31a and 31b are each configured by a conductive pattern provided on a flexible substrate.

It should be understood that in this specification, the term "wind around" is used to describe the concept including not only winding by one turn or more but also winding by the number (angle) of one turn or less (for example, a half-turn).

Further, each of the detection coil 31a and the detection coil 31b is provided so as to wind around the wire rope W along the extending direction (X-direction) of the wire rope W to detect (measure) the change in the magnetic flux in the direction penetrating the inside of the coil along the extending direction (X-direction) of the wire rope W. The detection coils 31a and 31b are configured to detect the change in the magnetic flux (magnetic field) which is caused to be periodically changed by the excitation unit 20 (excitation coil 21). Further, the detection coil 31a and the detection coil 31b output the detection signal indicating the change in the detected magnetic flux to the signal acquisition unit 42 (see FIG. 2) of the control board 40, which will be described later.

Note that the detection coil 31a and the detection coil 31b are differentially connected. In detail, by combining the detection coil 31a and the detection coil 31b, two coil loops opposite in direction are formed around the wire rope W on the X1-direction side and on the X2-direction side. Then, the detection signal by the detection coil 31a and the detection signal by the detection coil 31b are synthesized, and therefore, a detection signal in which the changes in the magnetic flux detected by the two coil loops opposite in the direction are synthesized is acquired. That is, the detection unit 30 is configured to acquire the detection signal by the differential coil by synthesizing the detection signal of the detection coil 31a and the detection signal of the detection coil 31b.

As shown in FIG. 2, the control board 40 is provided with a processing unit 41, a signal acquisition unit 42, and a communication unit 43. The control board 40 controls each part of the wire rope inspection device 101 by control processing performed by the processing unit 41. The processing unit 41 includes a processor, such as, e.g., a CPU (Central Processing Unit), a memory, an AD converter, and the like. The control board 40 controls the operation of the excitation unit 20 (excitation coils 21) based on the control signal from the processing unit 41. The signal acquisition unit 42 acquires (receives) the detection signal from the detection unit 30 (the detection coils 31a and 31b). The signal acquisition unit 42 includes an amplifier. The signal acquisition unit 42 amplifies the acquired detection signal and outputs (transmits) the amplified detection signal to the processing unit 41. The communication unit 43 is configured to be able to communicate with the processing device 102. The communication unit 43 includes a wireless communication module capable of wireless communication by a wireless LAN, Bluetooth (registered mark), and the like. The communication unit 43 outputs (transmits) the acquired detection signal to the processing device 102. Note that the connection between the wire rope inspection device 101 and the processing device 102 via the communication unit 43 may be a wired connection.

(Configuration of Processing Device)

As shown in FIG. 2, the processing device 102 is provided with a control unit 50, a storage unit 60, a touch panel 70, and a communication unit 80. The processing device 102 is provided separately from the wire rope inspection device 101. The processing device 102 is, for example, a tablet terminal, such as, e.g., a tablet PC (Personal Computer) used by an inspection operator performing the inspection of the wire rope W.

The control unit 50 controls each part of the processing device 102. The control unit 50 includes a processor, such as, e.g., a CPU, a memory, and the like. The control unit 50 performs the processing for determining the abnormal portion of the wire rope W, such as, e.g., a wire disconnection portion, based on the measurement result (detection signal) of the wire rope W received via the communication unit 80. Note that the detail of the abnormal portion determination processing by the control unit 50 will be described in detail later.

The storage unit 60 is, for example, a storage device including a flash memory. The storage unit 60 stores the information, such as, e.g., the acquired measurement result of the wire rope W and the acquired determination result of the abnormal portion of the wire rope W by the control unit 50. The storage unit 60 stores programs 61 for determining the abnormal portion of the wire rope W and processing parameters 62.

The touch panel 70 displays the information, such as, e.g., the measurement result of the wire rope W and the analysis result (the determination result of the abnormal portion) of the wire rope W by the control unit 50. Further, the touch panel 70 accepts the input operation by the inspection operator.

The communication unit 80 is configured to be able to communicate with the wire rope inspection device 101 and the control device 103d of the elevator 103. The communication unit 80 is a communication interface. Specifically, the communication unit 80 includes a wireless communication module capable of wireless communication via wireless LAN, Bluetooth, and the like. The processing device 102 receives the measurement result (detection signal) of the wire rope W by the wire rope inspection device 101 via the communication unit 80. The processing device 102 transmits a signal for instructing the initiation of the inspection via the communication unit 80 to the wire rope inspection device 101 and the elevator 103 (the control device 103d of the elevator 103) when the inspection of the wire rope W is initiated based on the input operation by the inspection operator.

Note that the processing device 102 is configured to acquire the signal indicating the position of the wire rope W together with the acquired detection signal (measurement result). The processing device 102 is configured to store the detection signal and the position information indicating the position of the wire rope W corresponding to the detection signal in association with each other. The position information of the wire rope W may be acquired by a position sensor, such as, e.g., an encoder, or may be calculated based on the operation rate of the elevator 103 and the elapse of the inspection time.

(Determination Processing of Abnormal Portion By Processing Device)

Next, with reference to FIG. 2 and FIGS. 5 to 12, the processing for determining the abnormal portion by the processing device 102 will be described. The wire rope inspection system 100 is configured to perform the determination for each abnormal portion type (wire disconnection, a kink, rust, adhesion of a foreign matter, and the like). In the first embodiment, an example in which abnormal portions as determination targets include two types of abnormal portions, i.e., wire disconnection and a kink, will be described.

As shown in FIG. 2, the control unit 50 of the processing device 102 includes a waveform generation unit 51, an extraction processing unit 52, a parameter setting unit 53, a first differential processing unit 54, a second differential processing unit 55, an addition processing unit 56, and a determination processing unit 57. Specifically, the hardware-based control unit 50 is configured to include, as functional blocks of the software (program 61), the waveform generation unit 51, the extraction processing unit 52, the parameter setting unit 53, the first differential processing unit 54, the second differential processing unit 55, the addition processing unit 56, and the determination processing unit 57. The control unit 50 is configured to perform the processing for determining an abnormal portion of the wire rope W by performing the program 61 based on the acquired detection signal.

Figure 5:
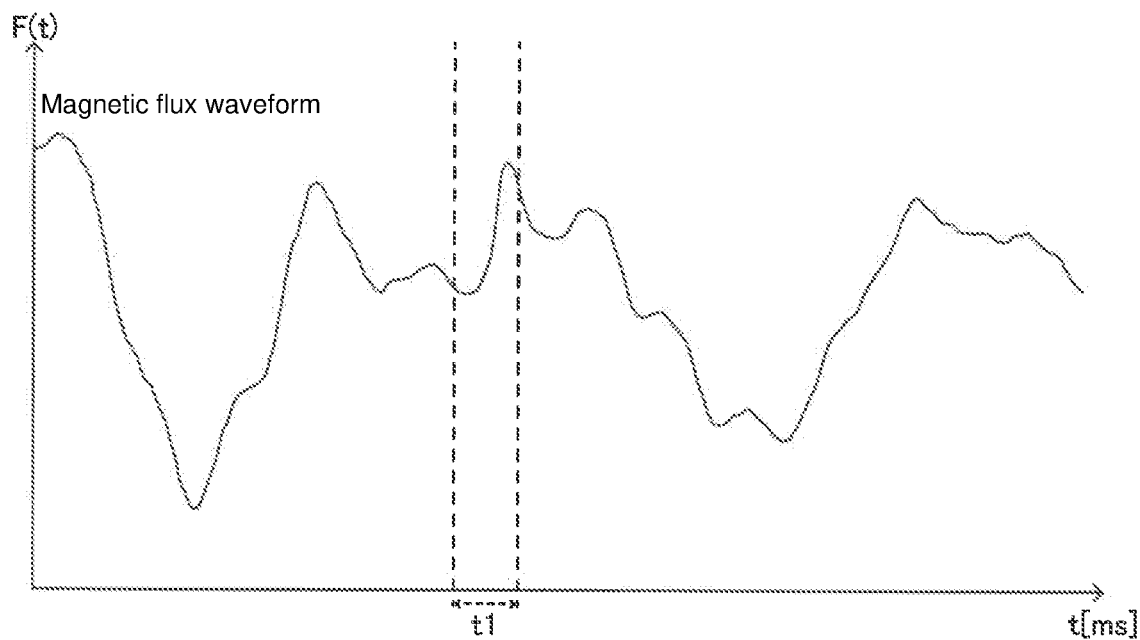
FIG. 5 is a diagram for explaining a generation of a magnetic flux waveform.

As shown in FIG. 5, the waveform generation unit 51 (control unit 50) generates a magnetic flux waveform, which is a signal waveform, based on the detection signal acquired from the wire rope inspection device 101 (detection unit 30) via the communication unit 80. The sampling frequency of the magnetic flux waveform is, for example, 1 [kHz]. Therefore, the generated magnetic flux waveform is a set of discrete detection signals acquired every one (1) [ms] (milliseconds) (see FIG. 9). Note that the waveform generation unit 51 generates a magnetic flux waveform by performing moving average processing every predetermined section (e.g., 20 [ms]) to reduce the electric noise.

That is, the waveform generation unit 51 is configured to generate a magnetic flux waveform by sampling the average value of a section including from ten (10) [ms] before the sampling time to ten (10) [ms] after the sampling time every one (1) [ms] with respect to the detection signal acquired every one (1) [ms].

Note that the magnetic flux waveform is represented by a graph in which the vertical axis represents a time [ms] and the horizontal axis represents the value F(t) (t: time) based on the detection signals acquired by the waveform generation unit 51. The section t1 in FIG. 5 is a section of a magnetic flux waveform corresponding to the abnormal portion (indicating the abnormal portion) due to the wire disconnection of the wire rope W. The generated magnetic flux waveform is represented such that the waveform of the abnormal portion is buried in a waveform of noise.

Figure 6:
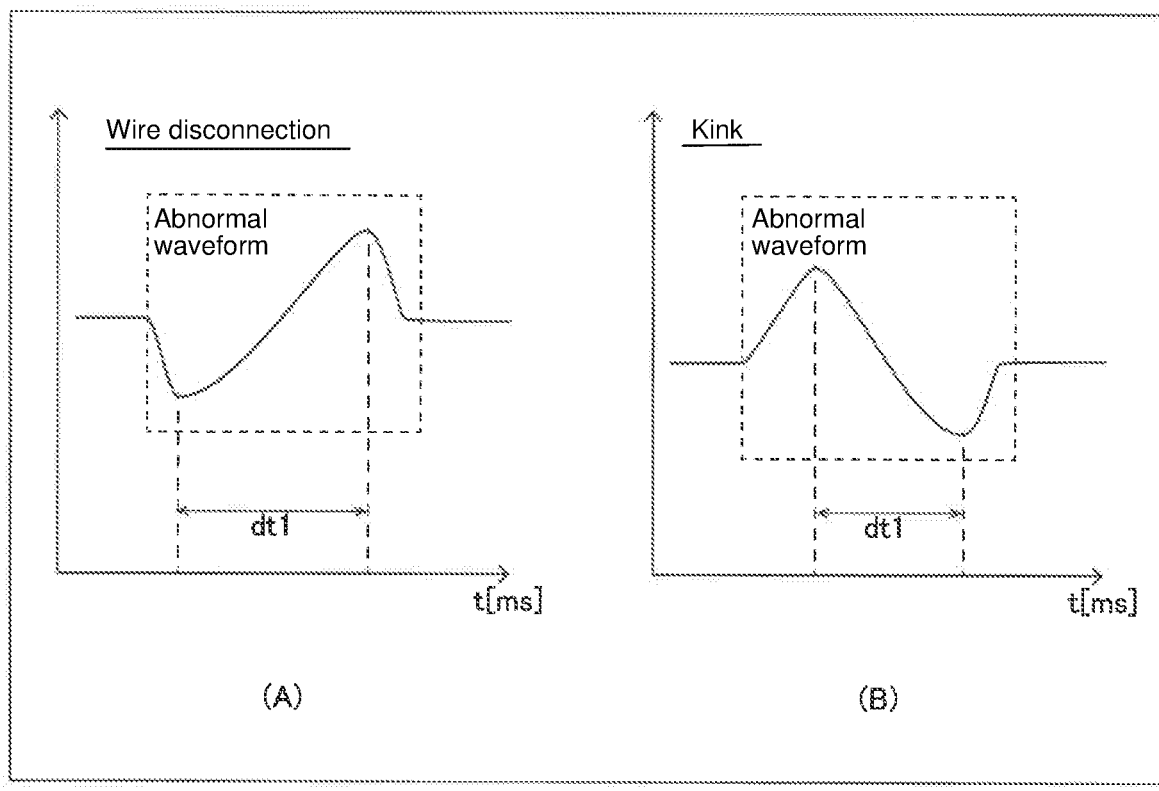
FIG. 6A is a diagram for explaining an abnormal waveform of an abnormal portion, the diagram showing the abnormal waveform at a wire disconnection portion.
FIG. 6B is a diagram for explaining an abnormal waveform indicating an abnormal portion, the diagram showing the abnormal waveform at a kinked portion.

Further, as shown in FIG. 6, the abnormal waveform, which a signal waveform indicating the abnormal portion of the wire rope W, is substantially constant in shape (width, inclination, curvature, etc.) depending on the type of the abnormal portion. Specifically, an abnormal waveform has either a positively sloped shape or a negatively sloped shape depending on the type of the abnormal portion.

For example, in a case where the type of the abnormal portion is wire disconnection, the abnormal waveform is positively sloped because the magnetic flux leaks out of the wire disconnection. In a case where the type of the abnormal portion is a kink, the abnormal waveform is negatively sloped, contrary to the case of the wire disconnection. Specifically, in the abnormal waveform of wire disconnection, the value detected along the time axis decreases once and then increases at a predetermined rate such that the waveform is positively sloped. Thereafter, the detected value decreases again. In the abnormal waveform indicating a kink, the value detected along the time axis increases once and then decreases at a predetermined rate such that the waveform is negatively sloped, as opposed to the case of wire disconnection. Thereafter, the detected value increases gain.

Figure 7:
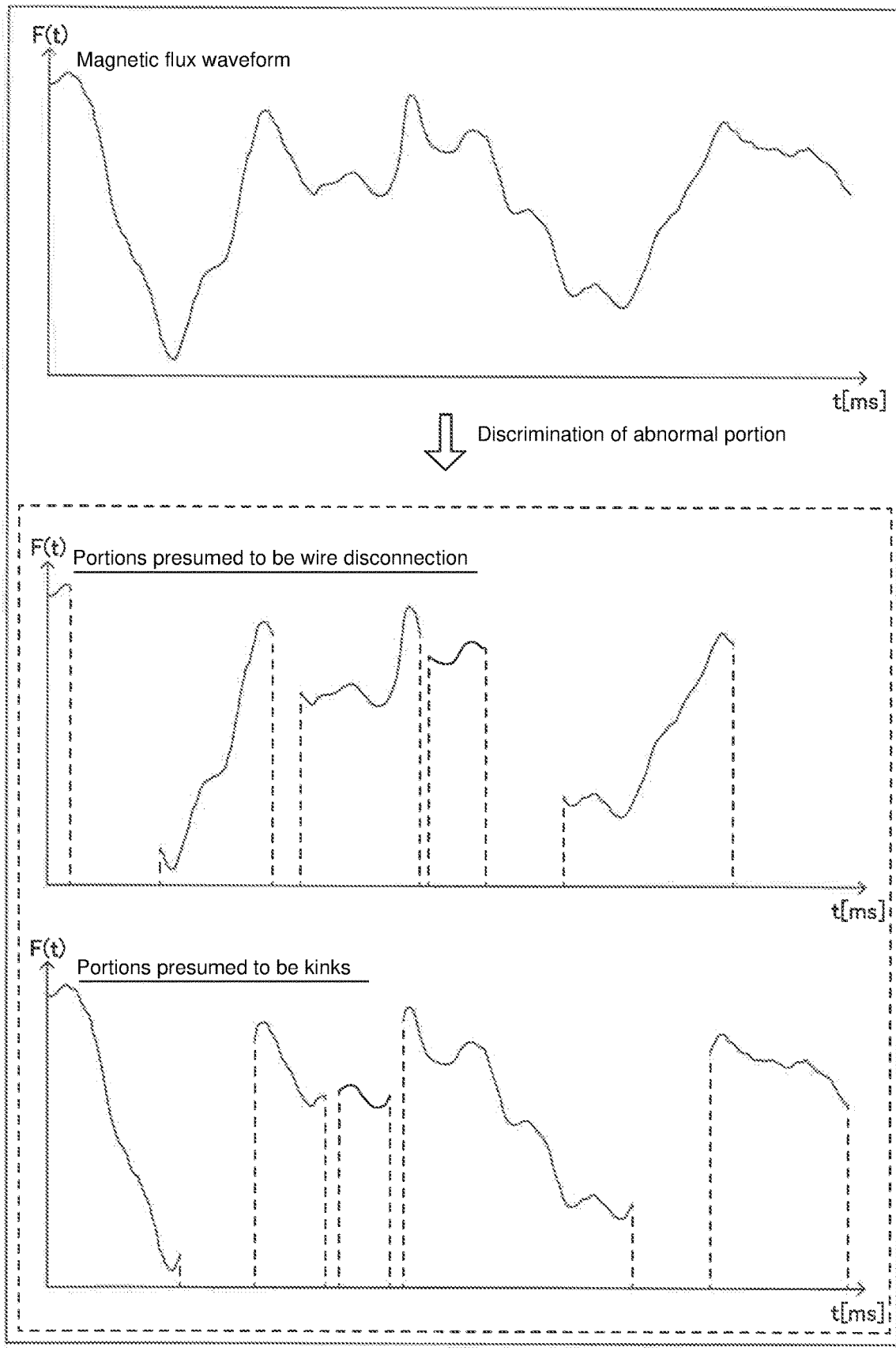
FIG. 7 is a diagram showing an example for distinguishing a magnetic flux waveform according to types of abnormal portions.

As shown in FIG. 7, in the first embodiment, the extraction processing unit 52 (the control unit 50) is configured to determine the type of the abnormal portion included in the generated magnetic flux waveform based on the shape of the generated magnetic flux waveform.

In other words, the extraction processing unit 52 is configured to extract a portion of the generated magnetic flux waveform assumed to be an abnormal portion that is a wire disconnection portion and a portion of the generated magnetic flux waveform assumed to be an abnormal portion that is a kinked portion from the generated magnetic flux waveform in a distinguished manner. For example, the extraction processing unit 52 extracts, every predetermined section, the portion of the magnetic flux waveform in which the shape of the magnetic flux waveform changes in the order of decreasing, increasing, and decreasing, as a portion of the magnetic flux waveform assumed as an abnormal portion that is a wire disconnection portion. Similarly, the extraction processing unit 52 extracts, every predetermined section, the portion of the magnetic flux waveform in which the shape of the magnetic flux waveform changes in the order of increasing, decreasing, and increasing, as a portion of the magnetic flux waveform assumed as an abnormal portion that is a kinked portion.

Figure 8:
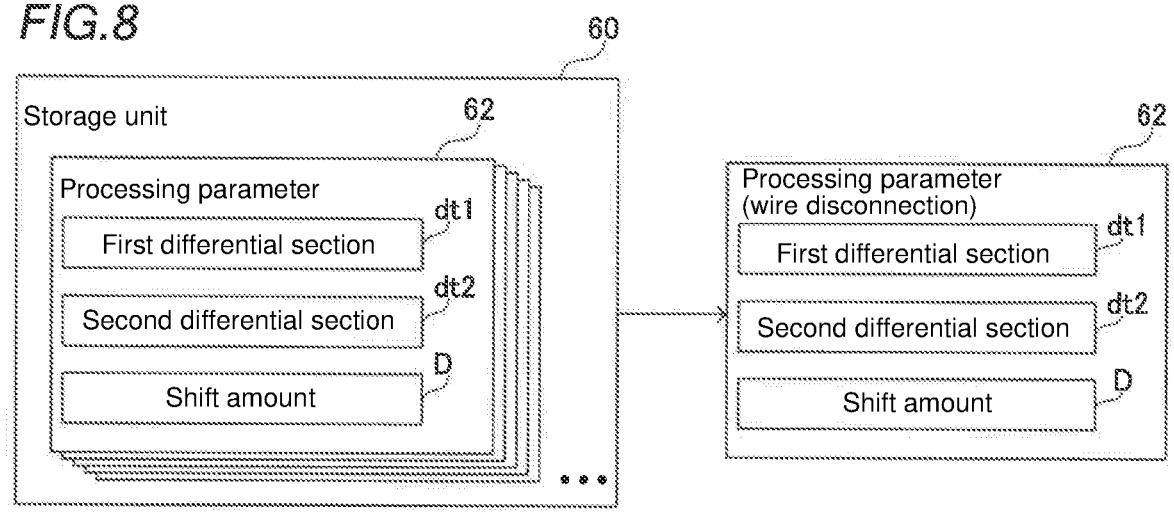
FIG. 8 is a diagram for explaining the setting of processing parameters.

Further, as shown in FIG. 8, the parameter setting unit 53 (the control unit 50) sets a processing parameter 62 for the processing for determining the abnormal portion of the wire rope W. Here, in the wire rope inspection system 100 according to the first embodiment, a plurality of processing parameters 62 is stored in advance in the storage unit 60 so as to correspond to each of the types (wire disconnection and a kink) of abnormal portions of the wire rope W to be inspected.

The processing parameters 62 include, for example, a first differential section dt1, a second differential section dt2, and a shift amount D, which will be described later. The storage unit 60 stores, as a table, the combination of the processing parameters 62 for each type of the abnormal portion of the wire rope W. The parameter setting unit 53 sets a first differential section dt1, a second differential section dt2, and a shift amount D corresponding to the abnormal portions of the wire disconnection when determining an abnormal portion due to wire disconnection. The parameter setting unit 53 sets a first differential section dt1, a second differential section dt2, and a shift amount D corresponding to the abnormal portion due to a kink when determining the abnormal portions of the kink. Note that the processing parameter 62 may be set so as to correspond to the type (width, material, etc.) of the wire rope W, which is an inspection target, in addition to the type of the abnormal portion.

<Differential Processing>

Figure 9:
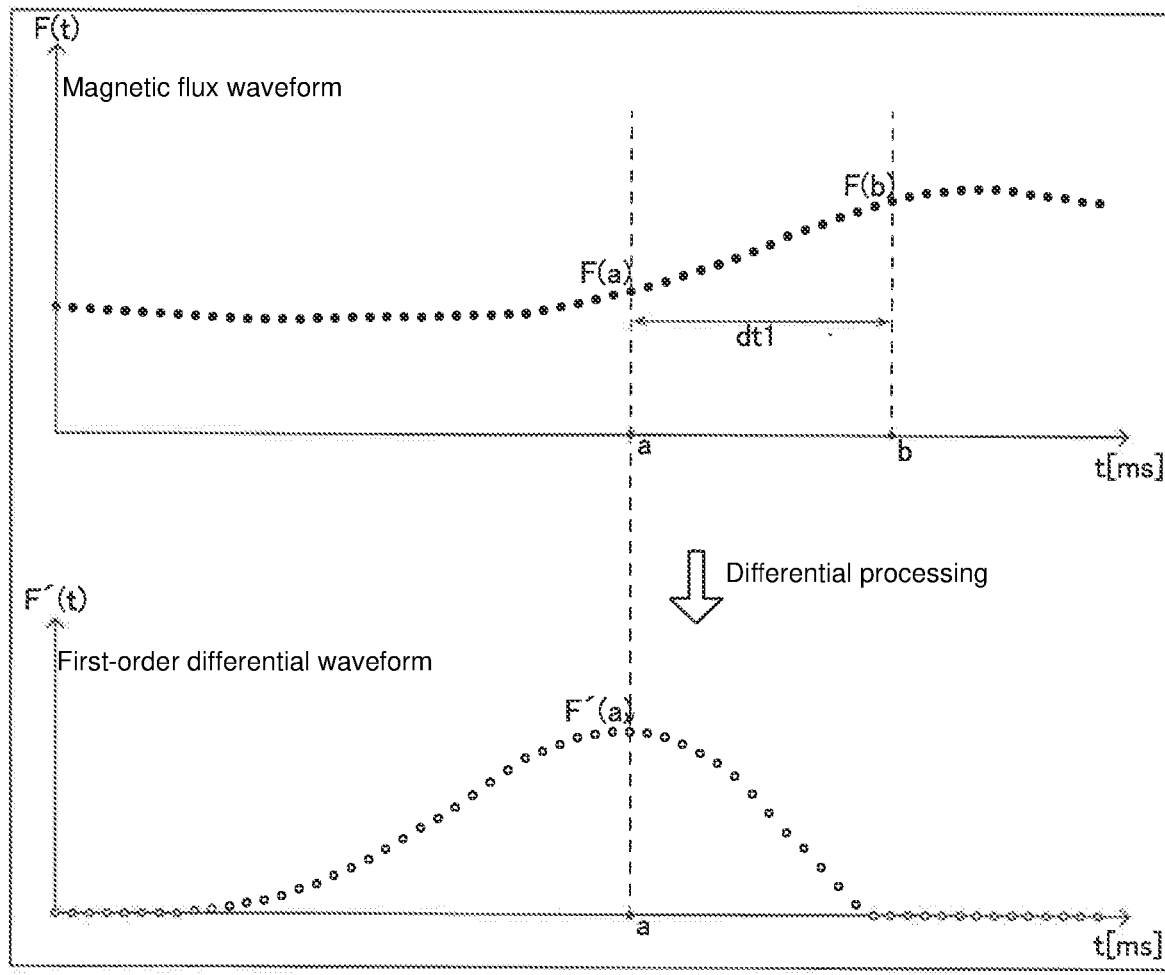
FIG. 9 is a diagram for explaining differential processing.
Figure 10:
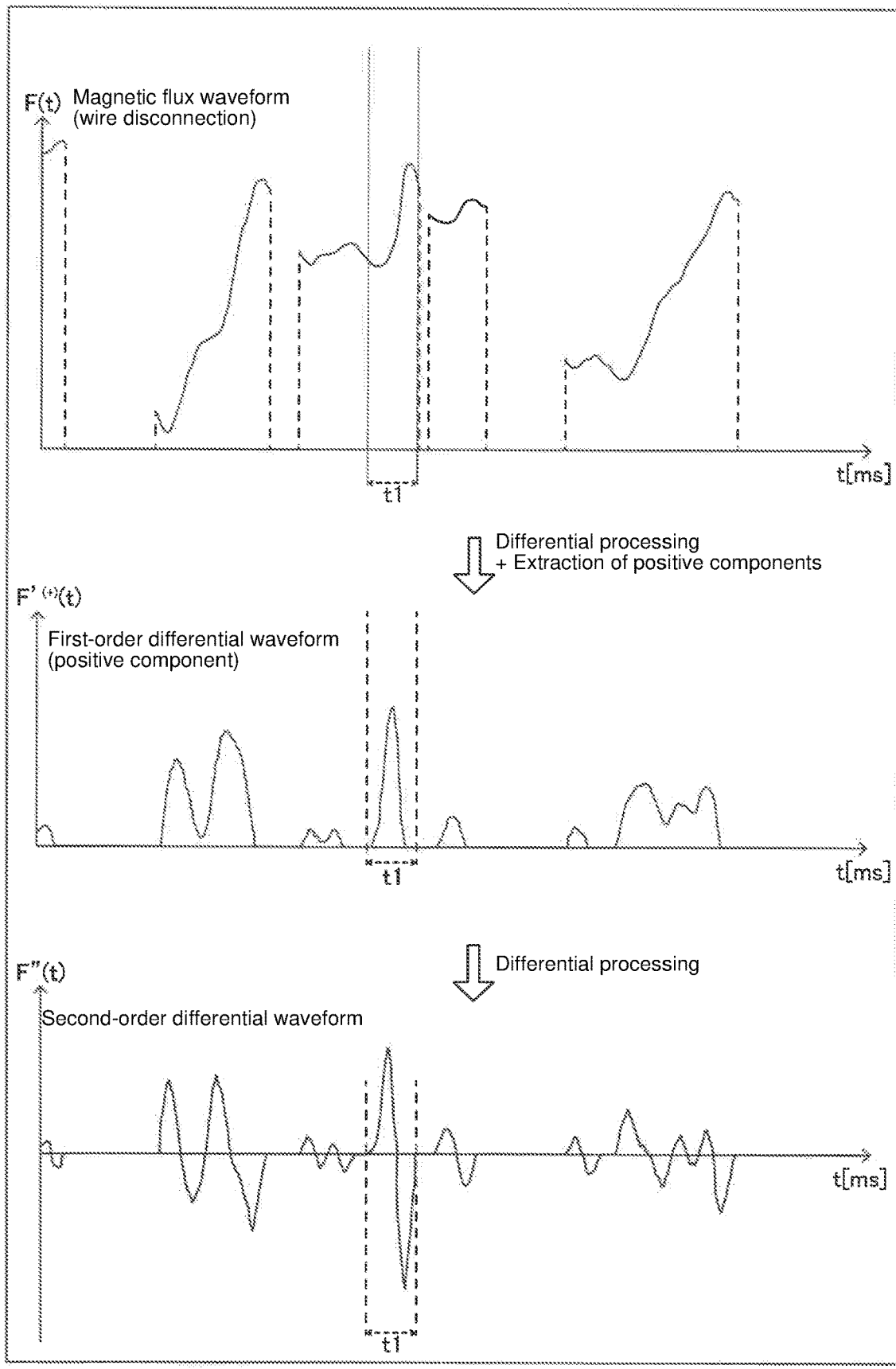
FIG. 10 is a diagram for explaining the generation of a second-order differential waveform.

As shown in FIGS. 9 and 10, in the first embodiment, the control unit 50 (the first differential processing unit 54 and the second differential processing unit 55) performs differential processing twice on the magnetic flux waveform to acquire a second-order differential waveform. Note that the following explanation is directed to the case in which determination of an abnormal portion among the two types of wire disconnection, i.e., a kink and wire disconnection, is performed.

As shown in FIG. 9, the first differential processing unit 54 (the control unit 50) sequentially performs first differential processing by a predetermined first differential section dt1 on the magnetic flux waveform in which the portion assumed to be wire disconnection to perform the determination of the abnormal portion of the wire disconnection along the time axis (horizontal axis). For example, in the case of performing the differential processing at the time point "a" of the magnetic flux waveform, the difference between the value F(b) of the magnetic flux waveform at the time "b" after the time point "a" by a predetermined first differential section dt1 and the value F(a) of the magnetic flux waveform at the time "a" is acquired, and first differential processing is performed at the time "a." That is, if the value of the result of performing the first differential processing at the time "a" is defined as F'(a), the relation F'(a)=F(b)−F(a), and b=a+dt1 is established. The first differential processing unit 54 sequentially performs first differential processing for each sampling period (1 [ms]) along the time axis to acquire a first-order differential waveform. The value of the first-order differential waveform is expressed as F'(t).

Note that as shown in FIG. 6, in the first embodiment, the first differential section dt1 is set based on the abnormal waveform that is a signal waveform indicating the abnormal portion of the wire rope W acquired in advance.

In the case of determining an abnormal portion due to wire disconnection, in the first embodiment of the wire rope inspection system 100, the first differential section dt1 is set to be a section substantially equal to the width of the positively sloped portion of the abnormal waveform indicating the portion of the wire disconnection acquired in advance and stored in the storage unit 60 as a processing parameter 62. For example, the first differential section dt1 in a case where the abnormal portion is a wire disconnection portion is 15 [ms] (the sampling number is 15). Similarly, in the case of determining the abnormal portion due to a kink, the first differential section dt1 is set to be a section substantially equal to the width of the negatively sloped portion of the abnormal waveform indicating the portion of a kink acquired in advance and is stored in advance in the storage unit 60 as a processing parameter 62.

Then, as shown in FIG. 10, in the first embodiment, the second differential processing unit 55 (the control unit 50) extracts, prior to performing second differential processing, either the positive component or the negative component of the first-order differential waveform based on the shape of the magnetic flux waveform.

In a case where the type of the abnormal portion is wire disconnection, the waveform corresponding to the abnormal portion is positively sloped. For this reason, the negatively sloped portion of the magnetic flux waveform is a waveform indicating noise rather than an abnormal portion. Therefore, there is no portion indicating an abnormal portion due to wire disconnection in the negative component of the first-order differential waveform. The second differential processing unit 55 extracts the positive component of the first-order differential waveform by setting (canceling) all negative components of the acquired first-order differential waveform to zero in the case of determining the abnormal portion due to the wire disconnection based on the shape of the magnetic flux waveform. Note that the value of the positive component of the first-order differential waveform is represented as $F'^{(+)}(t)$.

Note that in a case where the abnormal portion is a kinked portion, since the abnormal waveform is negatively sloped, the second differential processing unit 55 extracts the negative component of the first-order differential waveform based on the magnetic flux waveform.

The second differential processing unit 55 is configured to sequentially perform second differential processing on the positive component of the first-order differential waveform extracted based on the first-order differential waveform along the time axis by the second differential section dt2. The second differential processing is the same as the first differential processing. Further, the second differential section dt2 is set in advance based on the abnormal waveform indicating the abnormal portion of the wire disconnection and stored in the storage unit 60, in the same manner as in the first differential section dt1. For example, the second differential section dt2 is approximately half the length (e.g., 7 [ms]) of the first differential section dt1, which is approximately equal to the width of the positively sloped portion of the abnormal waveform of the wire disconnection. In this way, by performing the second differential processing, the second differential processing unit 55 generates a second-order differential waveform. Note that the value of the second-order differential waveform is expressed as $F''(t)$.

<Addition Processing>

Figure 11:
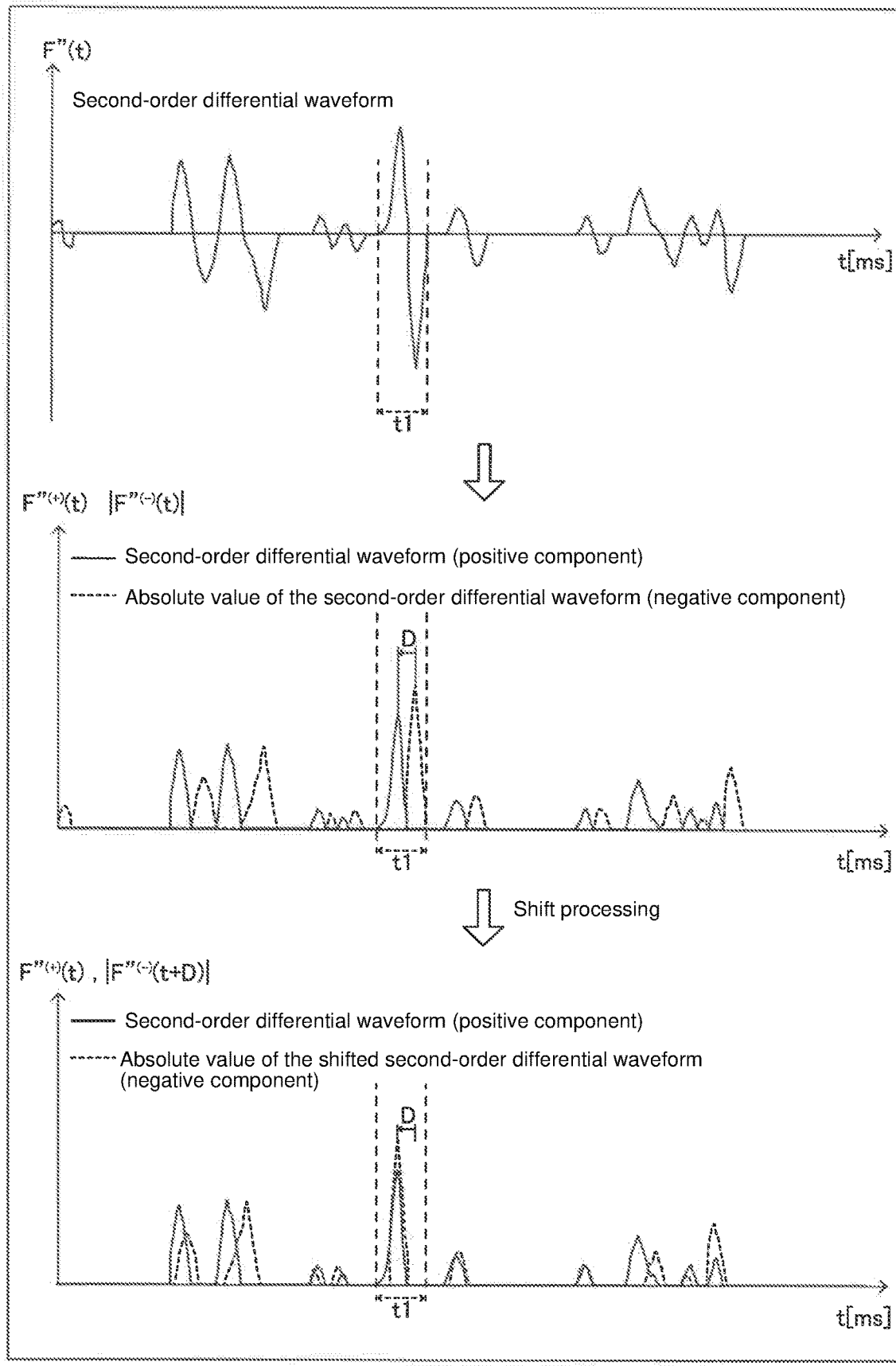
FIG. 11 is a diagram for explaining shift processing.
Figure 12:
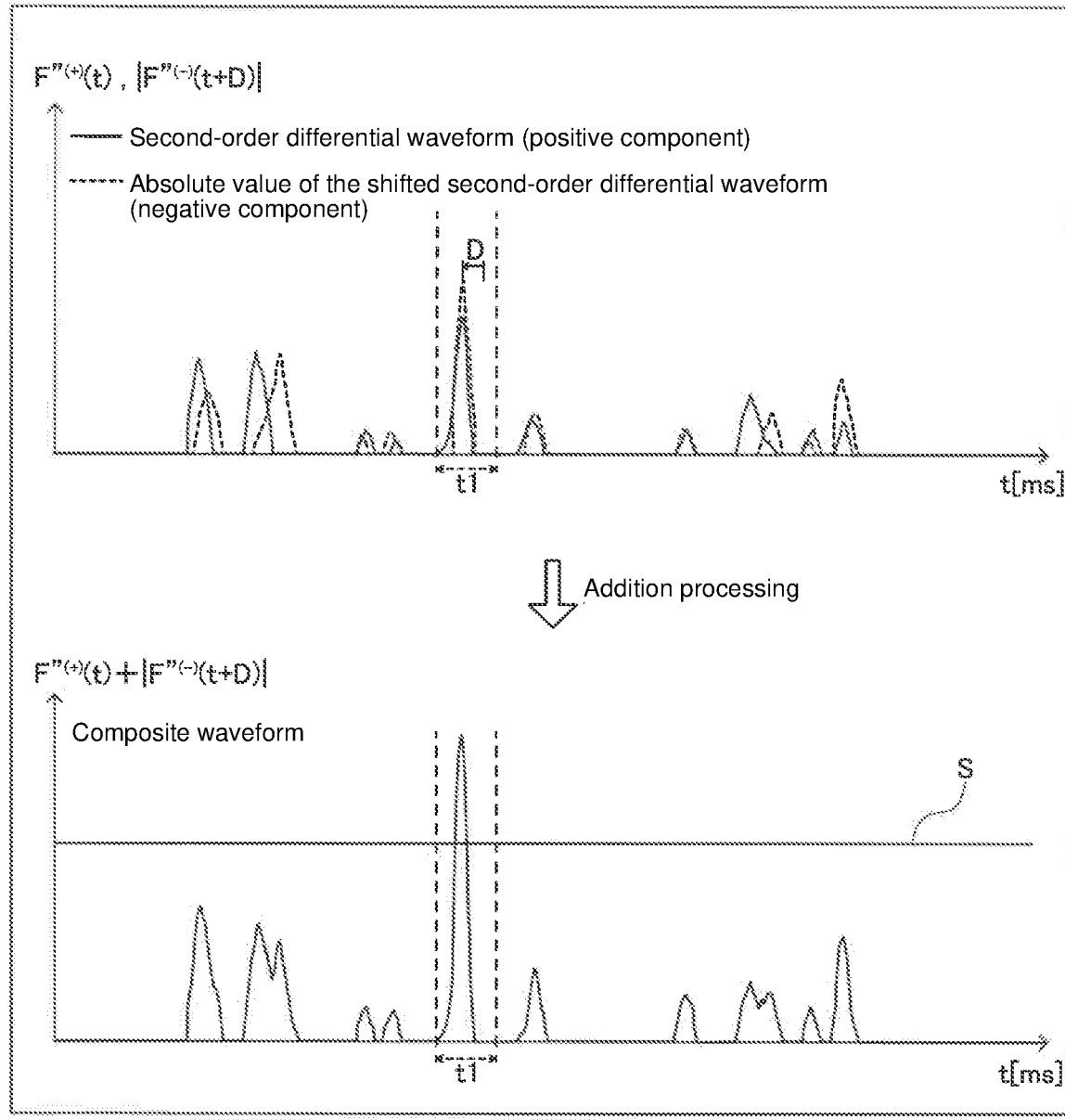
FIG. 12 is a diagram for explaining a composite waveform and a determination threshold.

As shown in FIGS. 11 and 12, in the first embodiment, the addition processing unit 56 (the control unit 50) is configured to add the positive component of the acquired second-order differential waveform and an absolute value of the negative component of the acquired second-order differential waveform in a state in which the portions (the portions at the section t1 in the figures) indicating the abnormal portion of the wire rope W are shifted to overlap with each other to generate a composite waveform.

Specifically, as shown in FIG. 11, the addition processing unit 56 acquires the positive component of the second-order differential waveform and the negative component of the second-order differential waveform. Then, the absolute value of the negative component of the second-order differential waveform is acquired. Note that the value of the positive component of the second-order differential waveform is expressed as $F''^{(+)}(t)$. Further note that the absolute value of the negative component of the second-order differential waveform is expressed as $|F''^{(-)}(t)|$.

Then, in the first embodiment, the addition processing unit 56 shifts the absolute value of the negative component of the second-order differential waveform along the time axis based on the shift amount D set in advance such that the portions (the portions corresponding the abnormal portion) indicating the abnormal portion of the wire rope W overlap with each other. Specifically, the addition processing unit 56 shifts the absolute value of the negative component of the second-order differential waveform by the magnitude of the shift amount D set in advance by the parameter setting unit 53 in the negative direction (the left direction of the horizontal axis) of the time axis. That is, the absolute value of the negative component of the shifted second-order differential waveform is expressed as $|F''^{(-)}(t+D)|$ Note that in the first embodiment, in the same manner as in the first differential section dt1 and the second differential section dt2, the shift amount D is set in advance based on the abnormal waveform indicating the abnormal portion and stored in the storage unit 60. The shift amount D is, for example, a value (e.g., 20 [ms]) greater than the first differential section dt1, which is approximately equal to the width of the positively sloped portion or the negatively sloped portion of the abnormal waveform.

Then, as shown in FIG. 12, the addition processing unit 56 adds the positive component of the second-order differential waveform and the absolute value of the shifted negative component of the second-order differential waveform to thereby generate a composite waveform. Note that the value of the generated composite waveform is expressed as $F''^{(+)}(t)+|F''^{(-)}(t+D)|$. Note that in the composite waveform, the difference between the abnormal portion and the noise is large as compared with the magnetic flux waveform.

<Determination Processing>

The determination processing unit 57 (the control unit 50) is configured to determine the abnormal portion of the wire rope W when the value (the value represented by $F''^{(+)}(t)+|F''^{(-)}(t+D)|$) based on the generated composite waveform is greater than a predetermined determination threshold S. The determination threshold S is preset, for example, by the parameter setting unit 53 so as to correspond to the set abnormal portion. Further, the determination threshold S may be set by being selected from a plurality of alternative thresholds based on the input operation by the inspection operator.

Specifically, in a case where the abnormal portion is a wire disconnection portion, a plurality of determination thresholds S is stored as processing parameters 62 in the storage unit 60 according to the number of wire disconnection. Then, based on the receipt of the operation of selecting the number of wire disconnection to be determined by the inspection operator, the determination threshold S corresponding to the number of the selected wire disconnection by the parameter setting unit 53.

Then, the determination processing unit 57 generates a determination result that the portion in which the value of the composite waveform is greater than the determination threshold S is determined as an abnormal portion. The generated determination result includes information capable of identifying the position determined to be the abnormal portion of the wire rope W. The determination processing unit 57 generates, for example, a determination result including position information indicating the position of the abnormal portion of the wire rope W by the distance acquired by setting the position from which the inspection of the wire rope W is started to 0. Note that even in the case of determining the abnormal portion due to a kink, the abnormal portion is determined by the same processing.

<Display of Result>

The control unit 50 caused the touch panel 70 to display the determination result (analysis result) of the abnormal portion by the determination processing unit 57. For example, the control unit 50 causes the touch panel 70 to display a display indicating the position of the wire rope W determined to be an abnormal portion, as a numerical value. The control unit 50 causes the touch panel 70 to display the type (wire disconnection or a kink) of the determined abnormal portion together with identifiable character information. Further, the control unit 50 may cause the touch panel 70 to display the value of the composite waveform in the case where it is determined to be an abnormal portion, in addition to the position of the wire rope W.

Wire Rope Inspection Method By First Embodiment

Figure 13:
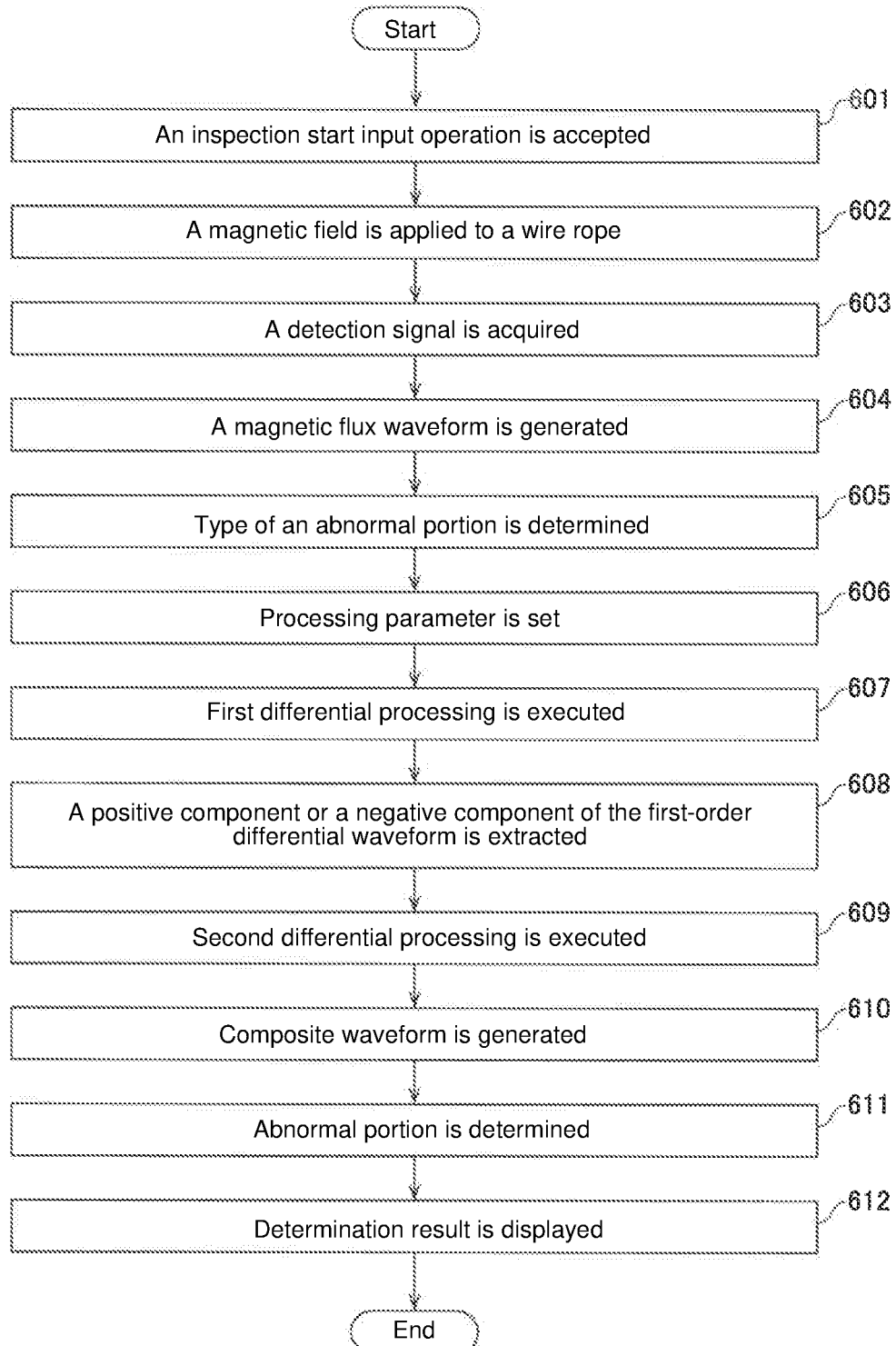
FIG. 13 is a flowchart for explaining a wire rope inspection method according to a first embodiment.

Next, with reference to FIG. 13, the wire rope inspection method according to the first embodiment will be described. This wire rope inspection method is performed by the wire rope inspection device 101 and the processing device 102 of the wire rope inspection system 100. That is, Step 602 and Step 603 indicate the control processing by the processing unit 41 of the wire rope inspection device 101. Step 601 and Step 604 to Step 612 indicate the control processing by the control unit 50 of the processing device 102.

First, in Step 601, an input operation to start the inspection of the wire rope W is accepted. Specifically, the inspection of the wire rope W is started based on the input operation to the touch panel 70. A signal indicating the start of the inspection is transmitted to the control device 103d of the elevator 103 and the processing unit 41 of the wire rope inspection device 101.

Next, in Step 602, the magnetic field is applied to the wire rope W. Then, in Step 603, the detection signal is acquired by detecting the change in the magnetic field of the wire rope W to which a magnetic field has been applied, while relatively moving with respect to the wire rope W.

Next, in Step 604, based on the acquired detection signal, a magnetic flux waveform is generated.

Next, in Step 605, the type of the abnormal portion included in the magnetic flux waveform is determined based on the shape of the generated magnetic flux waveform. Specifically, the portion to be assumed as the abnormal portion due to wire disconnection of the magnetic flux waveform and the portion to be assumed as the abnormal portion of the magnetic flux waveform due to a kink are distinguishably extracted.

Next, in Step 606, a processing parameter 62 corresponding to the type of the abnormal portion to be determined is set. Specifically, the first differential section dt1, the second differential section dt2, the shift amount D, and the determination threshold S for performing the determination processing are set in advance so as to correspond to each of the abnormal portion types (wire disconnection and a kink), prior to the determination processing.

Next, in Step 607, the first differential processing by the predetermined first differential section dt1 is sequentially performed on the magnetic flux waveform along the time axis. Further, a first-order differential waveform is acquired by performing the first differential processing. Then, in Step 608, the positive component or the negative component of the first-order differential waveform is extracted based on the shape of the magnetic flux waveform. Then, in Step 609, second differential processing by a predetermined differential section dt2 is sequentially performed on the positive component or the negative component of the first-order differential waveform along the time axis. Further, a second-order differential waveform is generated by performing the second differential processing.

Next, in Step 610, the positive component of the second-order differential waveform and an absolute value of the negative component of the second-order differential waveform are added in a state in which the portions indicating the abnormal portion of the wire rope W are shifted along the time axis so as to overlap with each other to generate a composite waveform. Specifically, by adding the absolute value of the negative component of the second-order differential waveform to the positive component of the second-order differential waveform in a state in which the absolute value of the negative component is shifted along the time axis based on the shift amount D set in advance, a composite waveform is generated.

Next, in Step 611, in a case where the value (the value represented by $F''^{(+)}(t)+|F''^{(-)}(t+D)|$) based on the generated composite waveform is greater than a predetermined determination threshold S, the abnormal portion of the wire rope W is determined. In Step 612, the determination result is displayed on the touch panel 70.

Note that the processing in Step 607 to Step 611 is performed for each type (wire disconnection and a kink) of the abnormal portion. Further, the generation of the magnetic flux waveform in Step 604, the determination of the type of the abnormal portion in Step 605, and the setting of the processing parameter 62 in Step 606 may be performed so as to perform any Step first.

(Effects of First Embodiment)

In the wire rope inspection method according to the first embodiment, the following effects can be acquired.

In the wire rope inspection method according to the first embodiment, as described above, a first-order differential waveform is acquired by performing first differential processing on the magnetic flux waveform which is a signal waveform based on the acquired detection signal. Then, the second differential processing is performed on the positive component or the negative component of the acquired first-order differential waveform to acquire a second-order differential waveform.

Here, a shape of a portion of a magnetic flux waveform corresponding to an abnormal portion has either a positively sloped shape or a negatively sloped shape depending on the type of the abnormal portion (wire disconnection, a kink, rust, adhesion of a foreign matter, and the like). Therefore, a waveform of a first-order differential waveform corresponding to an abnormal portion is included in either a positive component or a negative component of the first-order differential waveform depending on the type of the abnormal portion. For example, in a case where the abnormal portion is a wire disconnection portion, the shape of the waveform corresponding to the abnormal portion is a positively sloped portion. Therefore, in a case where an abnormal portion is a wire disconnection portion, the waveform of the portion of the first-order differential waveform corresponding to the abnormal portion is included only in the positive component of the first-order differential waveform.

In contrast, in the first embodiment, second differential processing is performed on the positive component or the negative component of the acquired first-order differential waveform to acquire the second-order differential waveform. Therefore, the second differential processing can be performed only on the positive component or the negative component extracted so as to correspond to the type of the abnormal portion. For this reason, the second differential processing can be performed in a state in which the waveform of the component in which no abnormal portion is included and only noise is included is canceled.

Then, in the first embodiment, as described above, the positive component of the acquired second-order differential waveform and the absolute value of the negative component of the acquired second-order differential waveform are added in a state in which the portions indicating the abnormal portion of the wire rope W are shifted so as to overlap with each other to generate a composite waveform.

With this, the composite waveform is generated by adding the positive component of the second-order differential waveform and the absolute value of the negative component of the second-order differential waveform such that the portions indicating the abnormal portion of the wire rope W overlap with each other based on the second-order differential waveform acquired in a state in which the waveform of the component in which no abnormal portion is included and only noise is included is canceled. Therefore, it is possible to generate a composite waveform in which the portion corresponding to the abnormal portion has a larger peak which is more conspicuous than the noise other than the abnormal portion. Therefore, it is possible to distinguish between the noise inherent in the wire rope W and the abnormal portion of the wire rope W by determining the peak of the composite waveform. Consequently, it is possible to accurately determine the abnormal portion of the wire rope W by distinguishing between the noise inherent in the wire rope W and the abnormal portion of the wire rope W.

Further, in the first embodiment, further effects can be obtained by the following configuration.

That is, in the first embodiment, Step 607 is performed in which first differential processing by a predetermined first differential section dt1 is sequentially performed on the magnetic flux waveform along the time axis. Further, Step S609 is performed in which second differential processing by the predetermined second differential section dt2 is sequentially performed on the positive component or the negative component of the acquired first-order differential waveform along the time axis.

By configuring as described above, by sequentially performing the first differential processing by a predetermined first differential section dt1 and sequentially performing the second differential processing by a predetermined second differential section dt2, it is possible to easily acquire the second-order differential waveform over a relatively wide range. Therefore, it is possible to easily generate a composite waveform over a relatively wide range based on the acquired second-order differential waveform. As a result, it is possible to easily and accurately determine the abnormal portion of the wire rope W over a relatively wide range by determining the peak of the composite waveform.

Further, in the first embodiment, Step 607 is performed in which the first differential processing by the first differential section dt1 set based on the abnormal waveform which is a signal waveform indicating the abnormal portion of the wire rope W acquired in advance is sequentially performed along the time axis. Further, Step S609 is performed in which the second differential processing by the second differential section dt2 set based on the abnormal waveform is sequentially performed along the time axis.

By configuring as described above, each of the first differential section dt1 and the second differential section dt2 is set based on the abnormal waveform acquired in advance. Therefore, by performing the first differential processing by the first differential section dt1 and the second differential processing by the second differential section dt2, it is possible to acquire an appropriate second-order differential waveform which is more appropriate to perform the determination of the abnormal portion. Therefore, it is possible to further emphasize the peak of the abnormal portion in the composite waveform generated based on the second-order differential waveform, which in turn can make it possible to determine the abnormal portion of the wire rope W more accurately.

Further, in the first embodiment, prior to Step 610 of generating the composite waveform, Step S606 is provided in which the shift amount D for generating the composite waveform based on the abnormal waveform which is a signal waveform indicating the abnormal portion of the wire rope W acquired in advance is set in advance. In Step S610 of generating the composite waveform, the absolute value of the negative composition of the second-order differential waveform, which is one of the positive component of the second-order differential waveform and the absolute value of the negative component of the second-order differential waveform, is added to the positive component of the second-order differential waveform, which is the other of them, in a state in which the one of the positive component and the absolute value of the negative component is shifted along the time axis based on the shift amount D set in advance, to thereby generate the composite waveform.

By configuring as described above, the shift amount D for generating the composite waveform based on the abnormal waveform which is a signal waveform indicating the abnormal portion acquired in advance is set in advance. Therefore, as compared with the case in which an appropriate shift amount D is calculated based on the generated shift amount, it is possible to easily generate the abnormal portion for determining the abnormal portion.

Further, in the first embodiment, prior to Step 609 of acquiring the second-order differential waveform, Step 608 is included in which either the positive component or the negative component of the first-order differential waveform is extracted based on the shape of the magnetic flux waveform.

In this configuration, the shape of the abnormal waveform indicating the abnormal portion is either a positively sloped shape or a negatively sloped shape depending on the type of the abnormal portion, and therefore, it is possible to easily extract the abnormal portion corresponding for each type of the abnormal portion from the magnetic flux waveform by distinguishing between the positively sloped shape and the negatively sloped shape of the magnetic flux waveform. Therefore, the positive component or the negative component of the first-order differential waveform can be easily extracted so as to correspond to the type of the abnormal portion, which makes it possible to easily acquire the second-order differential waveform in a state in which the waveform of the component not containing the abnormal portion but containing only noise is canceled. Consequently, it is possible to easily acquire the composite waveform for determining the abnormality of the wire rope W, which makes it possible to accurately and easily determine the abnormal portion of the wire rope W.

Second Embodiment

Figure 14:
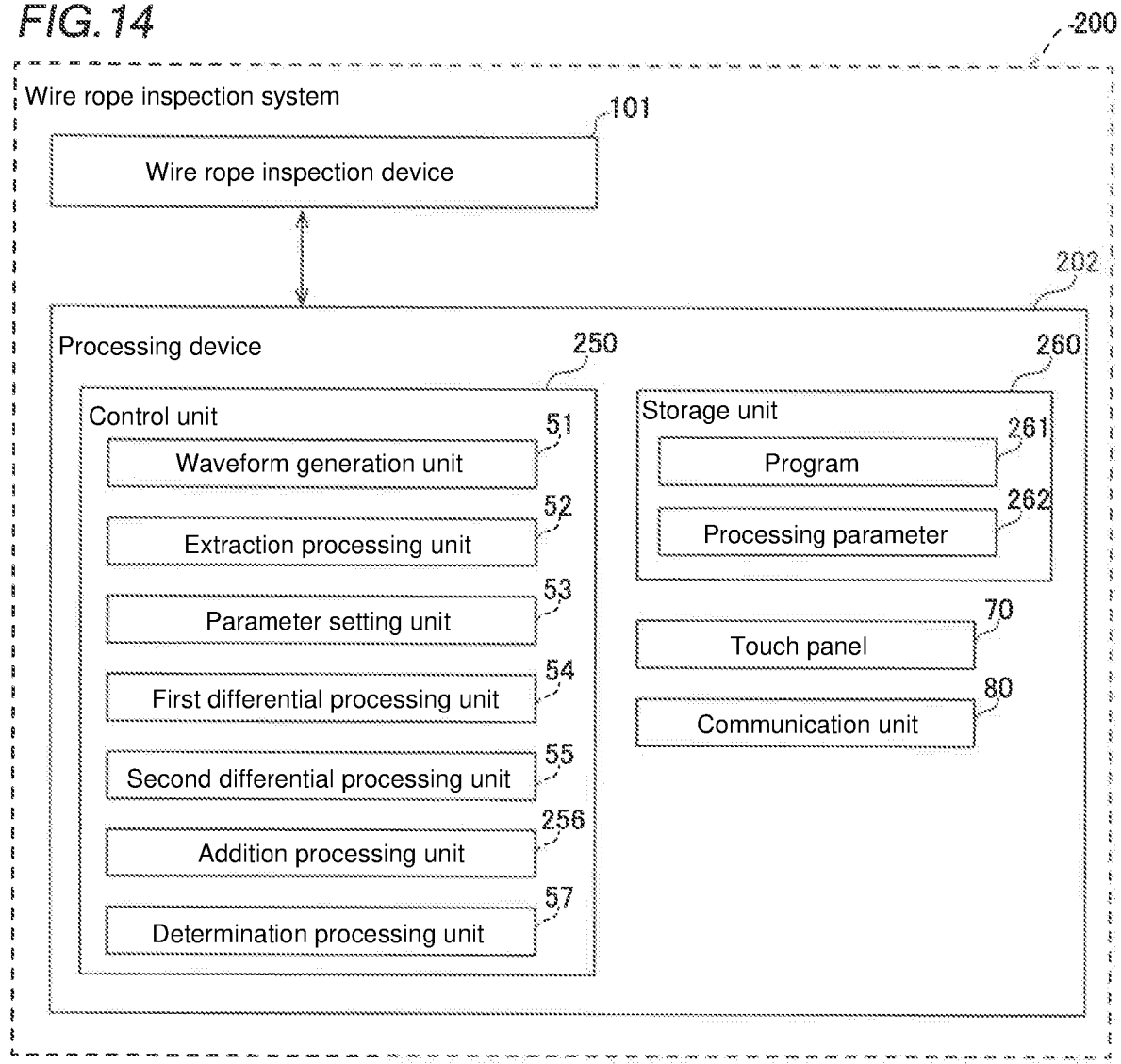
FIG. 14 is a block diagram showing an entire configuration of a wire rope inspection system according to a second embodiment.
Figure 15:
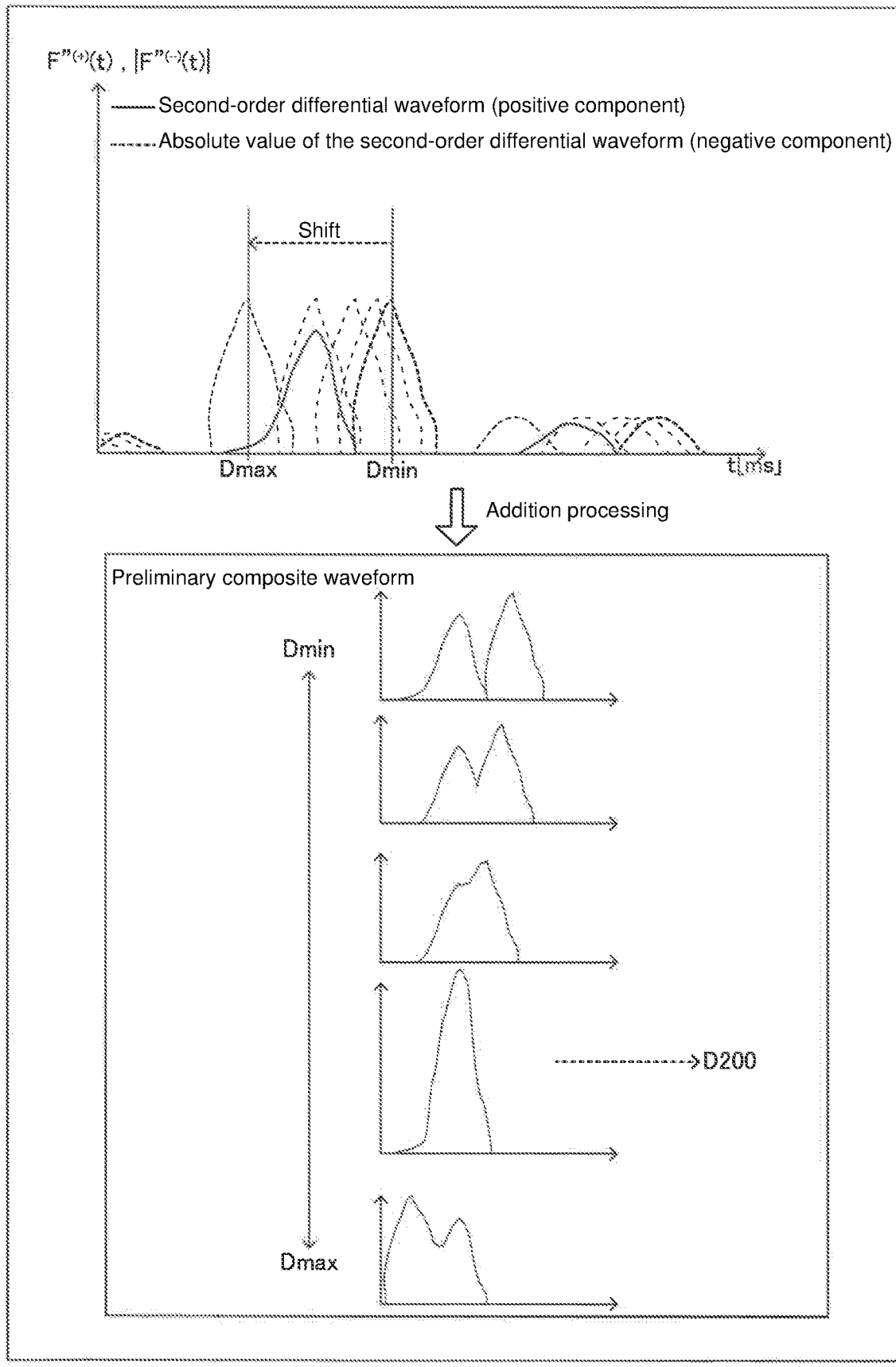
FIG. 15 is a diagram for explaining the setting of a shift amount according to a second embodiment.

With reference to FIGS. 14 and 15, a configuration of a wire rope inspection system 200 according to a second embodiment will be described. In this second embodiment, unlike the first embodiment in which the composite waveform is generated based on a preset shift amount D, an appropriate shift amount D200 is set (calculated) from a predetermined shift amount change range (Dmin to Dmax). Note that in the figures, the same component as that of the above-described first embodiment is denoted by the same reference numeral, and the descriptions thereof will be omitted.

Configuration of Wire Rope Inspection System of Second Embodiment

As shown in FIG. 14, the wire rope inspection system 200 according to the second embodiment is provided with a wire rope inspection device 101 and a processing device 202. Detecting the change in the magnetic flux of the wire rope W by the wire rope inspection device 101 is the same as in the first embodiment.

The processing device 202 is provided with a control unit 250, a storage unit 260, a touch panel 70, and a communication unit 80. The processing device 202 performs, in the same manner as in the processing device 102 of the first embodiment, processing for determining the abnormal portion of the wire rope W based on the measurement result of the wire rope W by the wire rope inspection device 101. The storage unit 260 stores, in the same manner as in the storage unit 60 of the first embodiment, information, such as, e.g., the measurement result of the wire rope W and the determination result of the abnormal portion. Then, in the second embodiment, the storage unit 260 stores programs 261 for determining the abnormal portion of the wire rope W and processing parameters 262.

(Determination Processing of Abnormal Portion By Processing Device)

The control unit 250 includes an addition processing unit 256. Specifically, the hardware-based control unit 250 is configured to include an addition processing unit 256 as a functional block of the program 261. The control unit 250 is configured to perform the processing for determining the abnormal portion of the wire rope W by performing the program 261 based on the acquired detection signal. The rest of the configuration of the control unit 250 is the same as that of the first embodiment.

That is, the control unit 250 acquires a second-order differential waveform by performing differential processing twice on the magnetic flux signal which is a signal waveform based on the detection signal acquired by performing the same control processing as in the first embodiment. The storage unit 260 stores a first differential section dt1 and a second differential section dt2, which are the same as those of the first embodiment, as processing parameters 262. On the other hand, in the second embodiment, the processing parameters 262 stored in advance do not include the shift amount, unlike in the first embodiment.

As shown in FIG. 15, in the second embodiment, the addition processing unit 256 (the control unit 250) is configured to set (calculate) a shift amount D200 for generating a composite waveform for performing determination processing from within the predetermined shift amount change range (Dmin to Dmax).

Specifically, the addition processing unit 256 adds the absolute value of the negative component of the acquired second-order differential waveform to the positive component of the acquired second-order differential waveform in a state in which the absolute value of the negative component is shifted along the time axis while changing the shift amount within a predetermined shift amount change range (Dmin to Dmax) to generate a plurality of preliminary composite waveforms. The predetermined shift amount change range is, for example, 0 [ms] or more and 30 [ms] or less. That is, Dmin is 0 [ms] and Dmax is 30 [ms]. The addition processing unit 256 generates a plurality of (31 pieces of) preliminary composite waveforms while changing the shift amount by 1 [ms] from 0 [ms] to 30 [ms]. The processing for generating the preliminary composite waveform is the same as in the addition processing by the addition processing unit 56 according to the first embodiment. Note that FIG. 15 illustrates five preliminary composite waveforms out of a plurality of preliminary composite waveforms.

The addition processing unit 256 acquires the maximum value of the plurality of generated preliminary composite waveforms. Then, the addition processing unit 256 selects a preliminary composite waveform with the largest maximum value acquired from the plurality of preliminary composite waveforms. Further, the addition processing unit 256 sets the shift amount by which the largest preliminary composite waveform has been generated from the shift amount change range (Dmin to Dmax), as the shift amount D200 for determining the abnormal portion.

Then, in the second embodiment, the addition processing unit 256 is configured to add the absolute value of the negative component of the second-order differential waveform acquired based on the set shift amount D200 to the positive component of the second-order differential waveform in a state in which the negative component of the second-order differential waveform is shifted along the time axis such that the portions indicating the abnormal portion of the wire rope W overlap with each other, to generate a composite waveform.

That is, the addition processing unit 256 is configured to select the shift amount D200 for determining the abnormal portion such that the portions indicating the abnormal portion of the wire rope W in the composite waveform overlap with each other, from within the shift amount change range (Dmin to Dmax). Further, the addition processing unit 256 performs the processing for setting the shift amount D200 from within the shift amount change range (Dmin to Dmax) every predetermined section (e.g., every 1 [m]) of the length of the wire rope W.

Note that the determination processing of the abnormal portion with respect to the composite waveform generated based on the set shift amount D200 is the same as that of the determination processing according to the first embodiment. Further, the rest of the configuration of the second embodiment is the same as that of the first embodiment.

Effects of Second Embodiment

In the second embodiment, the following effects can be acquired.

In the second embodiment, prior to generating the composite waveform, a plurality of preliminary composite waveforms is generated by adding the absolute value of the negative component of the second-order differential waveform, which is one of the positive component of the acquired second-order differential waveform and the absolute value of the negative component of the acquired second-order differential waveform, to the positive component of the second-order differential waveform, which is the other thereof, in a state in which the absolute value of the negative component of the second-order differential waveform is shifted along the time axis while changing the shift amount within the predetermined shift amount change range (Dmin to Dmax). Then, based on the shift amount D200 of the preliminary composite waveform in which the maximum value based on each of the plurality of generated preliminary composite waveforms is maximum, the composite waveform is generated by adding the absolute value of the negative component of the second-order differential waveform, which is one of the positive component of the second-order differential waveform and the absolute value of the negative component of the second-order differential waveform, to the positive component of the second-order differential waveform, which is the other thereof, in a state in which the absolute value of the negative component of the second-order differential waveform is shifted such that the portions indicating the abnormal portion of the wire rope W overlap with each other.

By configuring as described above, a composite waveform is generated based on the shift amount D200 of the preliminary composite waveform in which the maximum value based on each of the plurality of preliminary composite waveforms is largest. Therefore, when adding the positive component of the second-order differential waveform and the absolute value of the negative component of the second-order differential waveform to determine the abnormality of the wire rope W, it is possible to more appropriately set the shift amount D200 for generating the composite waveform such that the portion corresponding to the abnormal portion (the portion indicating abnormal portion) has a larger peak. Therefore, as compared with a case in which the composite waveform is generated based on one preset shift amount, it is possible to more accurately distinguish between the noise inherent in the wire rope W and the abnormal portion of the wire rope W. Consequently, it is possible to determine the abnormal portion of the wire rope W with higher accuracy.

Other effects of the second embodiment are the same as those of the first embodiment.

Third Embodiment

Figure 16:
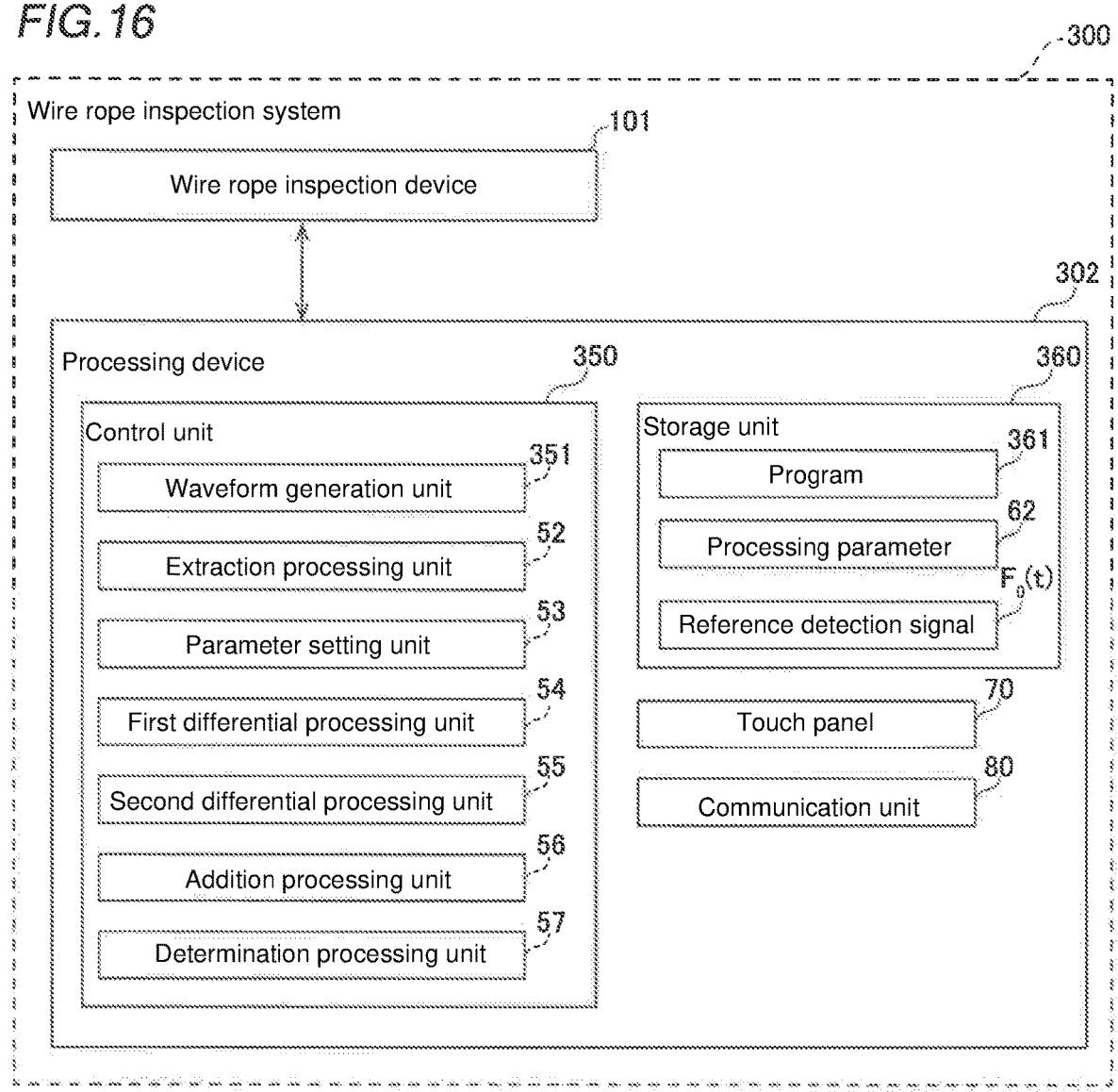
FIG. 16 is a block diagram showing an entire configuration of a wire rope inspection system according to a third embodiment.
Figure 17:
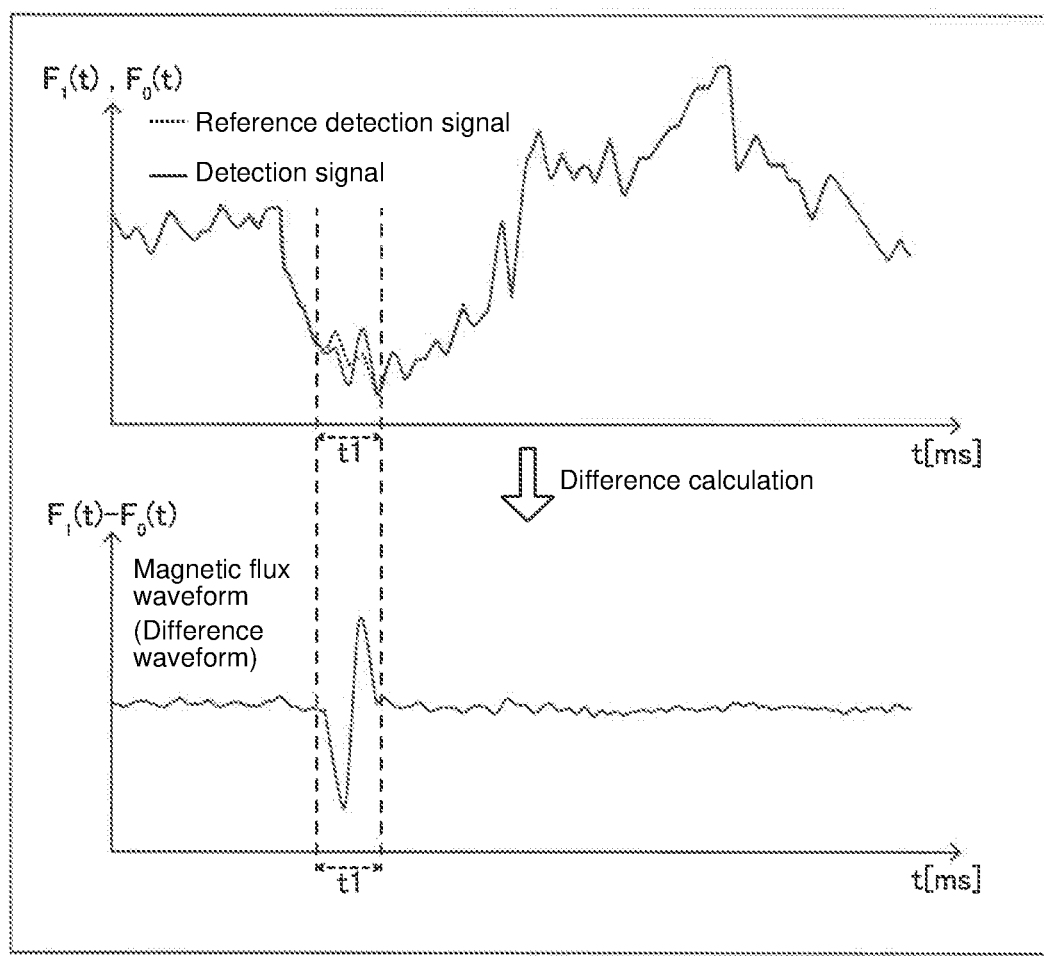
FIG. 17 is a diagram for explaining the acquisition of a magnetic flux waveform according to a third embodiment.

With reference to FIGS. 16 and 17, a configuration of a wire rope inspection system 300 according to a third embodiment will be described. Unlike the first and second embodiments in which the detection signal detected by the detection unit 30 is acquired as a magnetic flux waveform as it is (by performing the moving average processing), in the third embodiment, a magnetic flux waveform is generated based on the difference between a detection signal $F_1(t)$ and a reference detection signal $F_0(t)$ acquired in advance. Note that in the figures, the same component as that of the first and second embodiments is denoted by the same reference numeral, and the description thereof will be omitted.

Configuration of Wire Rope Inspection System by Third Embodiment

As shown in FIG. 16, the wire rope inspection system 300 according to the third embodiment is provided with a wire rope inspection device 101 and a processing device 302. Detecting the change in the magnetic flux of the wire rope W by the wire rope inspection device 101 is the same as in the first embodiment.

The processing device 302 is provided with a control unit 350, a storage unit 360, a touch panel 70, and a communication unit 80. The processing device 302 performs processing for determining an abnormal portion of a wire rope W based on the measurement result of the wire rope W by the wire rope inspection device 101, in the same manner as in the processing device 102 of the first embodiment. The storage unit 360 stores information, such as, e.g., the measurement result of the wire rope W and the determination result of the abnormal portion, in the same manner as in the storage unit 60 of the first embodiment. In the third embodiment, the storage unit 360 stores programs 361 for determining the abnormal portion of the wire rope W and the reference detection signal $F_0(t)$.

The reference detection signal $F_0(t)$ is a reference detection signal acquired by detecting the change in the magnetic flux of the wire rope W, which is an inspection target, in advance. The reference detection signal $F_0(t)$ is detected by the wire rope inspection device 101 before an abnormal portion occurs (when there exist few abnormal portion), for example, at the time of installing the wire rope W. In a case where a plurality of (four) wire ropes W has been installed in the elevator 103, the reference detection signal $F_0(t)$ for each of the plurality of wire ropes W is stored in the storage unit 360 in advance. Note that the reference detection signal $F_0(t)$ is stored in association with the position information of the wire rope W.

(Determination Processing of Abnormal Portion By Processing Device)

The control unit 350 includes a waveform generation unit 351. Specifically, the control unit 350 is configured to include a waveform generation unit 351 as a functional block of the program 361. The control unit 350 is configured to perform the processing for determining the abnormal portion of the wire rope W by performing the program 361 based on the acquired detection signal. The rest of the configuration of control unit 350 is the same as that of the first embodiment.

As shown in FIG. 17, the detection signal detected to determine the abnormal portion is represented as $F_1(t)$ with respect to the reference detection signal $F_0(t)$ stored in the storage unit 60 in advance. In the third embodiment, the waveform generation unit 351 (the control unit 350) generates a magnetic flux waveform (difference waveform) based on the difference ($F_1(t)-F_0(t)$) between the reference detection signal $F_0(t)$ and the acquired detection signals $F_1(t)$ to cancel out noise (change in the inherent magnetic characteristic) inherent in the wire rope W. In the generated magnetic flux waveform becomes a waveform in which the abnormal portion of the wire rope W has been extracted.

The waveform generation unit 351 is configured to generate a magnetic flux waveform by acquiring a difference between the reference detection signal $F_0(t)$ and the detection signal $F_1(t)$ at substantially the same position, based on the position information of the wire rope W. The waveform generation unit 351 generates, in the same manner as in the first embodiment, a magnetic flux signal by acquiring the difference in a state in which the moving average processing has been performed on the reference detection signal $F_0(t)$ and the detection signal $F_1(t)$.

Note that two differential processing to be performed on the generated magnetic flux waveform (differential waveform), the addition processing for generating a composite waveform, and the determination processing of the abnormal portion are the same as those of the first embodiment. The rest of the configuration of the third embodiment is the same as that of the first embodiment.

Effects of Third Embodiment

In the third embodiment, the following effects can be obtained.

In the third embodiment, the magnetic flux waveform is generated, prior to acquiring the first-order differential waveform, based on the difference between the reference detection signal $F_0(t)$ as a reference acquired by detecting the change in the magnetic flux of the wire rope W, which is an inspection target, in advance and the acquired detection signal $F_1(t)$.

By configuring as described above, the noise inherent in the wire rope W is common between the reference detection signal $F_0(t)$ acquired in advance and the detection signal $F_1(t)$ detected for determining the abnormal portion. Therefore, by acquiring the difference between the reference detection signal $F_0(t)$ and the detection signal $F_1(0$, it is possible to generate a magnetic flux waveform in a state in which the noise inherent in the wire rope W included in the detection signal $F_1(t)$ has been suppressed (canceled) Therefore, it is possible to generate the composite waveform by performing differential processing twice on the magnetic flux waveform with the noise suppressed. Therefore, it is possible to further suppress the noise in the composite waveform. Consequently, it is possible to more accurately determine the abnormal portion of the wire rope W.

The other effects of the third embodiment are the same as those of the first and second embodiments.

Fourth Embodiment

Figure 18:
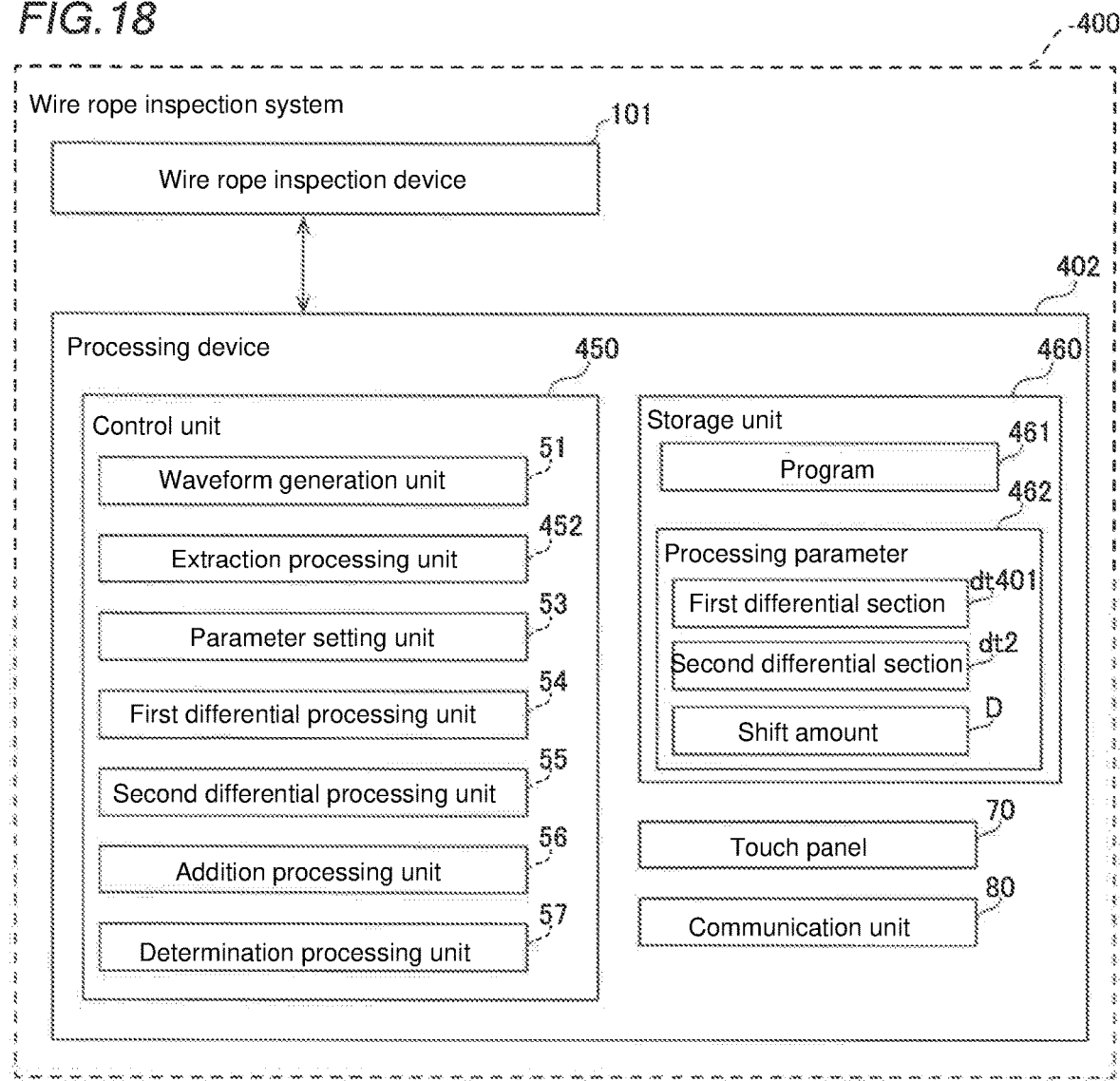
FIG. 18 is a block diagram showing an entire configuration of a wire rope inspection system according to a fourth embodiment.
Figure 19:
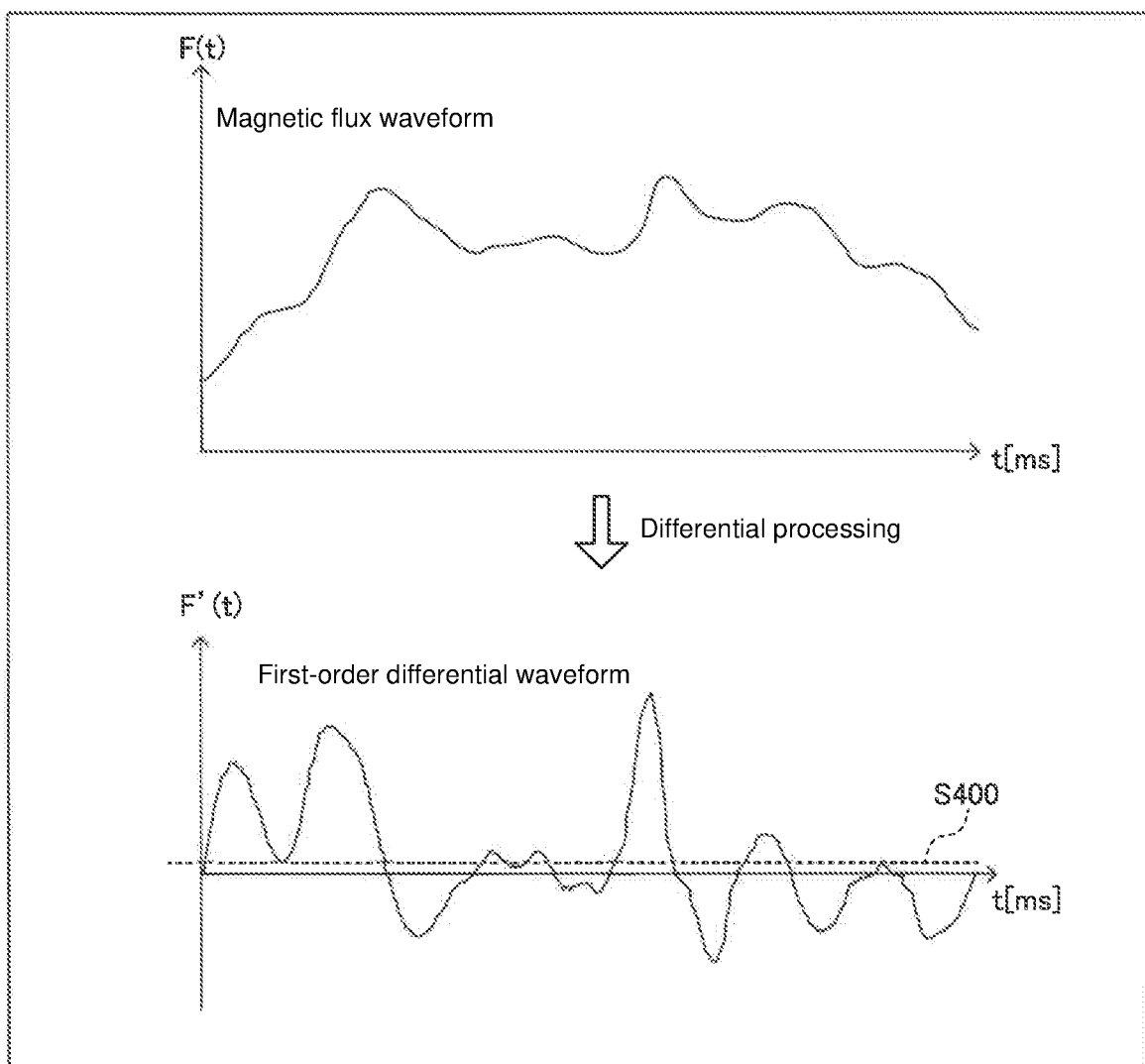
FIG. 19 is a diagram for explaining a first-order differential waveform and an extraction determination threshold according to a fourth embodiment.

With reference to FIGS. 18 and 19, a configuration of a wire rope inspection system 400 according to a fourth embodiment will be described. In this fourth embodiment, unlike the first embodiment in which it is configured to extract either the positive component or the negative component of a first-order differential waveform, based on the shape of the magnetic waveform, it is configured to extract the positive component or the negative component of the first-order differential waveform by determining whether or not the value based on the first-order differential waveform is larger than a predetermined extraction determination threshold S400.

Note that in the figures, the same component as that of the above-mentioned first to third embodiments is denoted by the same reference numeral, and the descriptions thereof will be omitted.

Configuration of Wire Rope Inspection System of Fourth Embodiment

As shown in FIG. 18, the wire rope inspection system 400 according to the fourth embodiment is provided with a wire rope inspection device 101 and a processing device 402. The detection of the change in the magnetic flux of the wire rope W by the wire rope inspection device 101 is the same as in the first embodiment.

The processing device 402 is provided with a control unit 450, a storage unit 460, a touch panel 70, and a communication unit 80. The processing device 402 performs, in the same manner as in the processing device 102 according to the first embodiment, the processing for determining the abnormal portion of the wire rope W based on the measurement result of the wire rope W by the wire rope inspection device 101. Further, the storage unit 460 stores (saves) the information, such as, e.g., the measurement result of the wire rope W and the determination result of the abnormal portion, in the same manner as in the storage unit 60 of the first embodiment. In the fourth embodiment, the storage unit 460 stores programs 461 for determining the abnormal portion of the wire rope W and processing parameters 462.
(Determination Processing of Abnormal Portion By Processing Device)

The control unit 450 includes an extraction processing unit 452. Specifically, the hardware-based control unit 450 is configured to include the extraction processing unit 452 as a functional block of the program 461. The control unit 450 is configured to perform the processing for determining the abnormal portion of the wire rope W by performing the program 461 based on the acquired detection signal. The rest of the configuration of the control unit 450 is the same as that of the first embodiment.

The control unit 450 generates a magnetic flux waveform by the same control processing as that of the first embodiment. Then, in the fourth embodiment, the control unit 450 is configured to perform first differential processing on the generated magnetic flux waveform, prior to the determination of the type of the abnormal portion. In the fourth embodiment, the processing parameters 462 stored in the storage unit 460 include a first differential section dt401, a second differential section dt2, and a shift amount D. In the fourth embodiment, the first differential section dt401 is the same value (e.g., 20 [ms]) for all abnormal portion types. The second differential section dt2 and the shift amount D are, in the same manner as in the first embodiment, are set based on the abnormal waveform indicating the abnormal portion acquired in advance for each type of abnormal portions (wire disconnection and a kink) and stored in the storage unit 460.

The first differential processing unit 54 of the control unit 450 acquires a first-order differential waveform by sequentially performing the first differential processing by the predetermined first differential section dt401 on the entirety of the generated magnetic waveform along the time axis, in the same manner as in the first embodiment.

Then, as shown in FIG. 19, in the fourth embodiment, the extraction processing unit 452 (the control unit 450) is configured to extract, prior to acquiring a second-order differential waveform, either the positive component or the negative component of the first-order differential waveform based on the comparison between the value based on the first-order differential waveform and a predetermined extraction determination threshold S400. In other words, the extraction processing unit 452 is configured to extract, based on the comparison with the predetermined extraction determination threshold S400, the portion of the first-order differential waveform which is assumed to be an abnormal portion of wire disconnection and the portion of the first-order differential waveform which is assumed to be an abnormal portion due to a kink, in a distinguished manner For example, the extraction processing unit 452 extracts the portion in which the value of the first-order differential waveform is larger than the predetermined extraction determination threshold S400, as a portion assumed to be an abnormal portion of wire disconnection. The second differential processing unit 55 of the control unit 450 is configured to acquire a second-order differential waveform for determining the abnormal portion of the wire disconnection by performing the processing for extracting the positive component on a portion of the first-order differential waveform which is assumed to be the abnormal portion of the wire disconnection and performing second differential processing.

Further, the extraction processing unit 452 extracts the portion in which the value of the first-order differential waveform is smaller than the predetermined value of the extraction determination threshold S400 as a portion assumed to be an abnormal portion due to a kink. Then, the second differential processing unit 55 of the control unit 450 is configured to acquire a second-order differential waveform for determining the abnormal portion due to a kink by performing the processing for extracting the negative component on a portion of the first-order differential waveform which is assumed to be an abnormal portion due to a kink and performing second differential processing.

The processing for acquiring the composite waveform from each acquired second-order differential waveform and the processing for determining the abnormal portion are the same as those of the first embodiment. The rest of the configuration of the fourth embodiment is the same as that of the first embodiment.

Effects of Fourth Embodiment

In this fourth embodiment, the following effects can be obtained.

In the fourth embodiment, prior to acquiring the second-order differential waveform, either the positive component or the negative component of the first-order differential waveform is extracted based on the comparison between the value based on the first-order differential waveform and the predetermined extraction determination threshold S400.

By configuring as described above, by using the predetermined extraction determination threshold S400, it is possible to easily distinguish the portion corresponding to the abnormal portion from the first-order differential waveform. Therefore, by using the extraction determination threshold S400, the positive component or the negative component of the first-order differential waveform can be easily extracted so as to correspond to the type of the abnormal portion. For this reason, it is possible to easily acquire the second-order differential waveform in a state in which the waveform of the component not including the abnormal portion but including only noise is canceled. Consequently, it is possible to easily acquire the composite waveform for determining the abnormality of the wire rope W, and therefore, it is possible to accurately and easily determine the abnormal portion of the wire rope W.

Note that the other effects of the fourth embodiment are the same as those of the first to third embodiments.

Modifications

It should be understood that the embodiments disclosed here are examples in all respects and are not restrictive. The scope of the present invention is shown by claims rather than the descriptions of the embodiments described above, and includes all changes (modifications) within the meaning of equivalent to claims.

Figure 20:
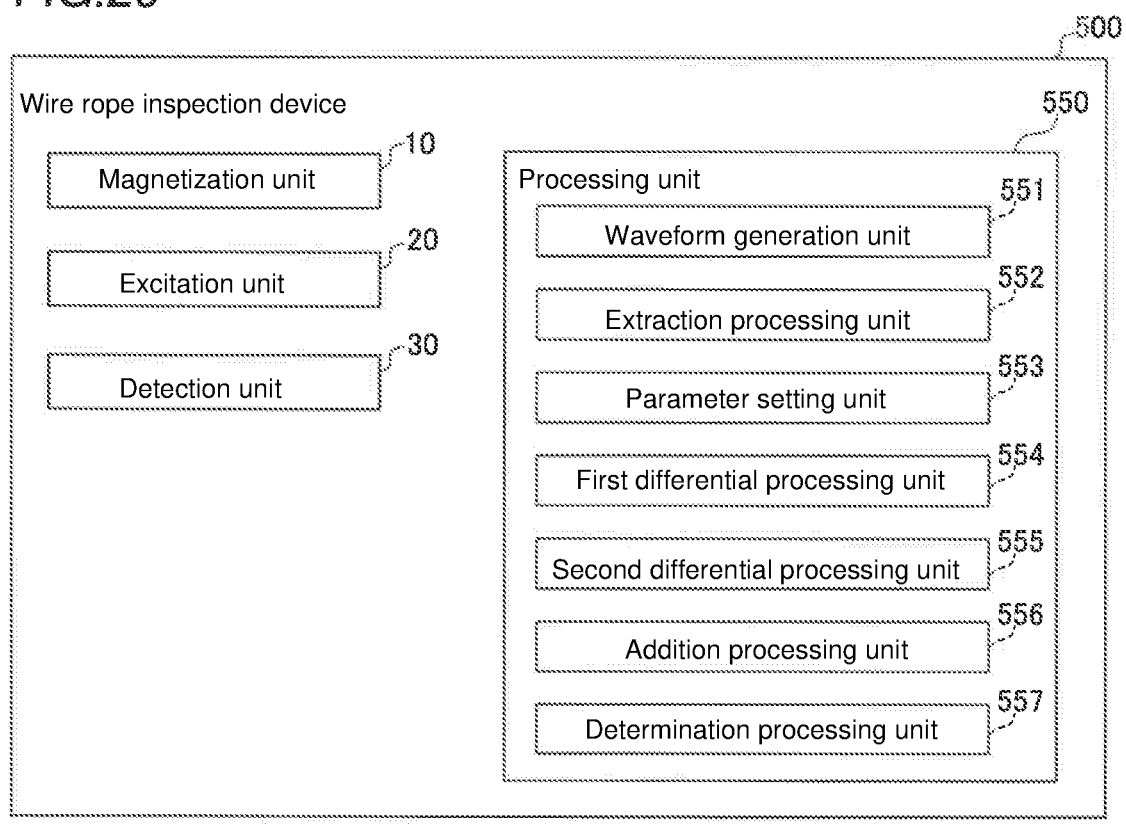
FIG. 20 is a block diagram showing an entire configuration of a wire rope inspection device according to a modification of first to fourth embodiments of the present invention.

For example, in the above-described first to fourth embodiments, an example is shown in which the wire rope inspection device 101 for detecting the change in the magnetic flux of the wire rope W and the processing device 102 (202, 302, 402) for performing the processing for determining the abnormal portion are configured separately, but the present invention is not limited thereto. In the present invention, as in the wire rope inspection device 500 by the modification shown in FIG. 20, it may be configured such that the processing for detecting the change in the magnetic flux of the wire rope W and determining the abnormal portion are performed by one (common) wire rope inspection device 500.

Specifically, the wire rope inspection device 500 is provided with, in the same manner as in the wire rope inspection device 101 of the first embodiment, a magnetization unit 10, an excitation unit 20, and a detection unit 30. Further, the wire rope inspection device 500 is provided with a processing unit 550. The processing unit 550 includes a waveform generation unit 551, an extraction processing unit 552, a parameter setting unit 553, a first differential processing unit 554, a second differential processing unit 555, an addition processing unit 556, and a determination processing unit 557.

The waveform generation unit 551, the extraction processing unit 552, the parameter setting unit 553, the second differential processing unit 554, the second differential processing unit 555, the addition processing unit 556, and the determination processing unit 557 are the same as the waveform generation unit 51, the extraction processing unit 52, the parameter setting unit 53, the first differential processing unit 54, processing unit 55, the addition processing unit 56, and the determination processing unit 57 of the control unit 50 according to the first embodiment, respectively. That is, the wire rope inspection device 500 is configured to perform, in the same manner as the control unit 50 of the processing device 102 according to the first embodiment, the processing for determining the abnormal portion of the wire rope W based on the detection signal acquired by the detection unit 30.

Note that, in the wire rope inspection device 500 according to the modification, in the same manner as in the wire rope inspection system 100 (200, 300, 400) of the first to fourth embodiments, by distinguishing between the noise inherent in the wire rope W and the abnormal portion of the wire rope W, it is possible to accurately determine the abnormal portion of the wire rope W.

Further, in the above-described first to fourth embodiments, an example is shown in which the processing device 102 (202, 302, and 402) is a tablet PC used by the inspection operator, but the present invention is not limited thereto. For example, the processing device that performs the determination processing of the abnormal portion may be a remotely located device such as a server device. That is, it may be configured to acquire the measurement result by the wire rope inspection device 101 by the processing device installed remotely and perform the determination of the abnormal portion at a position apart from the elevator 103 (the wire rope W).

Further, in the above-described first to third embodiments, an example is shown in which the first differential section dt1 is set to 15 [ms] and the second differential section dt2 is set to 7 [ms], based on the abnormal waveform which is a signal waveform indicating the abnormal portion of the wire rope W acquired in advance, but the present invention is not limited thereto. For example, the first differential section dt1 and the second differential section dt2 may be set based on an input operation by the inspection operator. Further, the first differential section dt1 which is set based on the abnormal waveform is not limited to 15 [ms], and the second differential section dt2 is not limited to 7 [ms].

Further, in the first to third embodiments, an example is shown in which the second differential section dt2 is about half the length of the first differential section dt1, but the present invention is not limited thereto. For example, the second differential section dt2 may be approximately equal in length to the first differential section dt1.

Further, in the first, third, and fourth embodiment embodiments, although an example is shown in which the shift amount D is set to 20 [ms] based on the abnormal waveform which is a signal waveform indicating the abnormal portion of the wire rope W acquired in advance, but the present invention is not limited thereto. For example, the shift amount D may be set based on the input operation by the inspection operator. Further, the shift amount D to be set based on the abnormal waveform is not limited to 20 [ms].

In the first and third embodiment, an example is shown in which the shift amount D is an amount larger than the first differential section dt1, but the present invention is not limited thereto. For example, the shift amount D may be set to be smaller than the first differential section dt1.

Further, in the above second embodiment, an example is shown in which the predetermined shift amount change range (Dmin to Dmax) is 0 [ms] or more and 30 [ms] or less, but the present invention is not limited thereto. For example, the minimum value Dmin of the shift amount change range may be a value other than 0 [ms], and the maximum value Dmax may be a value other than 30 [ms].

Further, in the above-described first to third embodiments, an example is shown in which the type of the abnormal portion is discriminated and determined based on the generated magnetic waveform. Further, in the above-described fourth embodiment, an example is shown in which the type of the abnormal portion is discriminated and determined based on the comparison between the value based on the first-order differential waveform and the predetermined extraction determination threshold S400. However, the present invention is not limited thereto. For example, it may be configured to not perform control to determine the type of the abnormal portion with respect to the magnetic flux waveform or the first-order differential waveform. Specifically, it may be configured such that the type of the abnormal portion to be determined based on the input operation by the inspection operator is set in advance and that either the positive component or the negative component of the first-order differential waveform is extracted based on a type of a preset abnormal portion.

Further, in the above-described fourth embodiment, an example is shown in which either the positive component or the negative component of the first-order differential waveform is extracted by determining whether or not it is larger than one extraction determination threshold S400, but the present invention is not limited thereto. For example, it may be configured such that a plurality of predetermined extraction determination thresholds is set so as to correspond to the type of the abnormal portion.

Specifically, it may be configured such that a portion in which the value of the first-order differential waveform is larger than a first threshold and that a portion in which the value of the first-order differential waveform is smaller than a second threshold different from the first threshold is acquired as a portion which is presumed to be the abnormal portion due to a kink. Further, the predetermined extraction determination threshold S400 may be, for example, 0. That is, it may be configured such that the portion in which the value of the first-order differential waveform is positive is set as a portion for determining the abnormal portion due to wire disconnection and that the portion in which the first-order differential waveform is negative is set as a portion for determining the abnormal portion due to a kink.

Further, in the above-described first to fourth embodiments, an example is shown in which the types of the abnormal portion to be determined are two types of wire disconnection and a kink, but the present invention is not limited thereto. For example, instead of a kink, adhesion of a foreign matter such as iron powder, rust, or the like may be determined as an abnormal portion. Further, it may be configured to determine more than two types of abnormal portions. Alternatively, only one type of abnormal portion may be determined.

Further, in the above-described first to fourth embodiments, an example is shown in which the magnetic flux waveform which is a signal waveform based on the acquired detection signal is subjected to moving average processing in the ranges of 10 points (20 ms) before and after each sampling, but the present invention is not limited thereto. Further, the range of the moving average processing may be in a range other than 20 [ms]. Further, it is not necessary to perform the moving average processing when generating the magnetic flux waveform. Further, noise cancellation processing other than the moving average processing, such as, e.g., low-pass filter processing, may be performed to generate a magnetic flux waveform.

Further, in the above-described first to fourth embodiments, an example is shown in which the wire rope W of the elevator 103 is inspected, but the present invention is not limited thereto. For example, it may be configured to inspect a wire rope other than the wire rope of the elevator, such as, e.g., a wire rope of a crane or a ropeway.

In the above-described first to fourth embodiments, an example is shown in which the two detection coils 31*a* and 31*b* of the detection unit 30 are each independent straddle-type coil (saddle-type coil), but the present invention is not limited thereto. For example, the detection unit 30 may be configured by one set of solenoidal coils arranged to be wound around the wire rope W and connected differentially.

Further, in the above-described first to fourth embodiments, an example is shown in which the excitation coil 21 is provided to wind around the outer side of the detection coils 31*a* and 31*b* with respect to the wire rope W, the present invention is not limited thereto. For example, the excitation unit 20 and the detection unit 30 may be arranged side by side along the extending direction of the wire rope W.

Further, in the above-described first to fourth embodiments, an example is shown in which the magnetization portion 10*a* and the magnetization portion 10*b* are arranged so as to face each other across the wire rope W are arranged with the respective N-poles oriented toward the wire rope W, but the present invention is not limited thereto.

For example, two magnetization portions may be arranged with N-pole and the S-pole oriented toward the wire rope W. Further, the two magnetization portions may be arranged such that the N-pole and the S-pole are arranged along the extending direction of the wire rope W, rather than arranged along the direction facing each other. In this case, the two magnetization portions may be oriented in the same or different orientations. Further, the magnetization unit may be arranged such that a magnetic field is applied from a direction shifted obliquely from the direction parallel along the extending direction of the wire rope W. Further, one magnetization portion may be arranged on one side of the direction intersecting the extending direction of the wire rope W. Further, it may be configured to detect a magnetic flux without aligning the magnetic field without providing a magnetization unit.

Further, in the above-described first to fourth embodiments, an example is shown in which the magnetization unit 10 is configured by permanent magnets, but the present invention is not limited thereto. For example, the magnetization unit may be configured by electromagnets.

Further, in the above-described first to fourth embodiments, an example is shown in which the detection coils 31*a* and 31*b* are provided for each of the four wire ropes W, but the present invention is not limited thereto. For example, it may be configured such that the detection coil detects the magnetic flux of one or more and three or less wire ropes W to detect a magnetic or that the detection coil detects the magnetic flux of five or more wire rope W. Further, it may be configured to detect magnetic fluxes of a plurality of wire ropes W by one detection coil.

[Aspects]

It will be understood by those skilled in the art that the above-described exemplary embodiments are concrete examples of the following aspects.

(Item 1)

A wire rope inspection method comprising the steps of:
applying a magnetic field to a wire rope that is an inspection target;
acquiring a detection signal by detecting a change in a magnetic flux of the wire rope to which the magnetic field has been applied, while relatively moving with respect to the wire rope;
acquiring a first-order differential waveform by performing first differential processing on a magnetic flux waveform that is a signal waveform based on the acquired detection signal;
acquiring a second-order differential waveform by performing second differential processing on a positive component or a negative component of the acquired first-order differential waveform;
generating a composite waveform by adding the positive component of the acquired second-order differential waveform and an absolute value of the negative component of the acquired second-order differential waveform in a state in which portions indicating an abnormal portion of the wire rope are shifted along a time axis to overlap with each other; and
determining the abnormal portion of the wire rope in a case where a value based on the generated composite waveform is greater than a predetermined determination threshold.

(Item 2)

The wire rope inspection method as recited in the above-described Item 1, wherein the step of acquiring the first-order differential waveform includes a step of sequentially performing the first differential processing by a predetermined first differential section on the magnetic flux waveform along the time axis, and wherein the step of acquiring the second-order differential waveform includes a step of sequentially performing the second differential processing by a predetermined second differential section on the positive component or the negative component of the first-order differential waveform acquired by sequentially performing the first differential processing along the time axis.

(Item 3)

The wire rope inspection method as recited in the above-described Item 2,
wherein the step of sequentially performing the first differential processing along th wherein the step of sequentially performing the first differential processing along the time axis includes a step of sequentially performing the first differential processing by the first differential section along the time axis, the first differential section being set based on an abnormal waveform acquired in advance, the abnormal waveform being a signal waveform indicating the abnormal portion of the wire rope, and
wherein the step of sequentially performing the second differential processing along the time axis includes a step of sequentially performing the second differential processing by the second differential section along the time axis, the second differential section being set based on the abnormal waveform.

(Item 4)

The wire rope inspection method as recited in any one of the above-described Items 1 to 3, further comprising the step of:
prior to the step of generating the composite waveform, setting a shift amount for generating the composite waveform based on an abnormal waveform acquired in advance, the abnormal waveform being a signal waveform indicating the abnormal portion of the wire rope,
wherein the step of generating the composite waveform includes a step of generating the composite waveform by adding one of the positive component of the second-order differential waveform and the absolute value of the negative component of the second-order differential waveform to the other in a state in which the one of the positive component and the absolute value of the negative component is shifted along the time axis based on the shift amount set in advance.

(Item 5)

The wire rope inspection method as recited in any one of the above-described Items 1 to 3, further comprising the steps of:
prior to the step of generating the composite waveform, generating a plurality of preliminary composite waveforms by adding one of the positive component of the acquired second-order differential waveform and the absolute value of the negative component of the acquired second-order differential waveform to the other in a state in which the one of the positive component and the absolute value of the negative component is shifted along the time axis while changing a shift amount within a predetermined shift amount change range,
wherein the step of generating the composite waveform includes a step of generating the composite waveform by adding one of the positive component of the second-order differential waveform and the absolute value of the negative component of the second-order differential waveform to the other in a state in which the one of the positive component and the absolute value of the negative component is shifted along the time axis such that portions of the second-order differential waveform indicating the abnormal portion of the wire rope overlap with each other, based on the shift amount of the preliminary composite waveform with a largest maximum value based on each of the plurality of generated preliminary composite waveforms.

(Item 6)

The wire rope inspection method as recited in any one of the above-described Items 1 to 5, further comprising the step of:
prior to the step of acquiring the first-order differential waveform,
generating the magnetic flux waveform based on a difference between a reference detection signal as a reference and the acquired detection signal, the reference detection signal being acquired by detecting a change in a magnetic flux of the wire rope that is an inspection target in advance.

(Item 7)

The wire rope inspection method as recited in any one of the above-described Items 1 to 6, further comprising the step of:
prior to the step of acquiring the second-order differential waveform,
extracting either the positive component or the negative component of the first-order differential waveform based on a shape of the magnetic flux waveform.

(Item 8)

The wire rope inspection method as recited in any one of the above-described Items 1 to 6, further comprising the steps of:

prior to the step of acquiring the second-order differential waveform, acquiring either the positive component or the negative component of the first-order differential waveform based on a comparison between a value based on the first-order differential waveform and a predetermined extraction determination threshold.

(Item 9)

A wire rope inspection system comprising:

a wire rope inspection device configured to detect a change in a magnetic flux of a wire rope that is an inspection target; and a processing device configured to perform processing for determining an abnormal portion of the wire rope based on a measurement result of the wire rope by the wire rope inspection device, wherein the wire rope inspection device includes an excitation unit configured to apply a magnetic flux to the wire rope and a detection unit configured to acquire a direction signal by detecting the change in the magnetic flux of the wire rope to which a magnetic field has been applied, while relatively moving with respect to the wire rope, wherein the processing device includes:

a first differential processing unit configured to acquire a first-order differential waveform by performing first differential processing on a magnetic flux waveform that is a signal waveform based on the detection signal acquired by the detection unit;

a second differential processing unit configured to acquire a second-order differential waveform by performing second differential processing on a positive component or a negative component of the first-order differential waveform acquired by the first differential processing unit;

an addition processing unit configured to generate a composite waveform by adding a positive component of the second-order differential waveform acquired by the second differential processing unit and an absolute value of a negative component of the second-order differential waveform acquired by the second differential processing unit in a state in which portions of the second-order differential waveform indicating the abnormal portion of the wire rope are shifted along a time axis to overlap with each other; and a determination processing unit configured to determine the abnormal portion of the wire rope in a case where a value based on the composite waveform generated by the addition processing unit is greater than a predetermined determination threshold.

(Item 10)

A wire rope inspection device comprising:

an excitation unit configured to apply a magnetic field to a wire rope that is an inspection target;

a detection unit configured to acquire a detection signal by detecting a change in a magnetic flux of the wire rope to which a magnetic field has been applied by the excitation unit, while relatively moving with respect to the wire rope; and a processing unit configured to perform processing for determining an abnormal portion of the wire rope based on the detection signal acquired by the detection unit, wherein the processing unit includes:

a first differential processing unit configured to acquire a first-order differential waveform by performing first differential processing on a magnetic flux waveform that is a signal waveform based on the detection signal acquired by the detection unit;

a second differential processing unit configured to acquire a second-order differential waveform by performing second differential processing on a positive component or a negative component of the first-order differential waveform acquired by the first differential processing unit;

an addition processing unit configured to generate a composite waveform by adding a positive component of the second-order differential waveform acquired by the second differential processing unit and an absolute value of a negative component of the second-order differential waveform acquired by the second differential processing unit in a state in which portions of the second-order differential waveform indicating the abnormal portion of the wire rope are shifted along a time axis to overlap with each other; and a determination processing unit configured to determine the abnormal portion of the wire rope in a case where a value based on the composite waveform generated by the addition processing unit is greater than a predetermined determination threshold.

The invention claimed is:

1. A wire rope inspection method comprising the steps of:

applying a magnetic field to a wire rope that is an inspection target;

acquiring a detection signal by detecting a change in a magnetic flux of the wire rope to which the magnetic field has been applied, while relatively moving with respect to the wire rope;

acquiring a first-order differential waveform by performing first differential processing on a magnetic flux waveform that is a signal waveform based on the acquired detection signal;

acquiring a second-order differential waveform by performing second differential processing on a positive component or a negative component of the acquired first-order differential waveform;

generating a composite waveform by adding the positive component of the acquired second-order differential waveform and an absolute value of the negative component of the acquired second-order differential waveform in a state in which at least one of portions of the acquired second-order differential waveform corresponding to the positive component and the absolute value of the negative component is shifted along a time axis such that the portions overlap with each other, the portions indicating an abnormal portion of the wire rope; and determining the abnormal portion of the wire rope in a case where a value based on the generated composite waveform is greater than a predetermined determination threshold.

2. The wire rope inspection method as recited in claim 1, wherein the step of acquiring the first-order differential waveform includes a step of sequentially performing the first differential processing by a predetermined first differential section on the magnetic flux waveform along the time axis, and wherein the step of acquiring the second-order differential waveform includes a step of sequentially performing the second differential processing by a predetermined second differential section on the positive component or the negative component of the first-order differential waveform acquired by sequentially performing the first differential processing along the time axis.

3. The wire rope inspection method as recited in claim 2,
wherein the step of sequentially performing the first differential processing along the time axis includes a step of sequentially performing the first differential processing by the first differential section along the time axis, the first differential section being set based on an abnormal waveform acquired in advance, the abnormal waveform being a signal waveform indicating the abnormal portion of the wire rope, and
wherein the step of sequentially performing the second differential processing along the time axis includes a step of sequentially performing the second differential processing by the second differential section along the time axis, the second differential section being set based on the abnormal waveform.

4. The wire rope inspection method as recited in claim 1, further comprising the step of:
prior to the step of generating the composite waveform,
setting a shift amount for generating the composite waveform based on an abnormal waveform acquired in advance, the abnormal waveform being a signal waveform indicating the abnormal portion of the wire rope,
wherein the step of generating the composite waveform includes a step of generating the composite waveform by adding one of the positive component of the second-order differential waveform and the absolute value of the negative component of the second-order differential waveform to the other in a state in which the one of the positive component and the absolute value of the negative component is shifted along the time axis based on the shift amount set in advance.

5. The wire rope inspection method as recited in claim 1, further comprising the steps of:
prior to the step of generating the composite waveform,
generating a plurality of preliminary composite waveforms by adding one of the positive component of the acquired second-order differential waveform and the absolute value of the negative component of the acquired second-order differential waveform to the other in a state in which the one of the positive component and the absolute value of the negative component is shifted along the time axis while changing a shift amount within a predetermined shift amount change range,
wherein the step of generating the composite waveform includes a step of generating the composite waveform by adding one of the positive component of the second-order differential waveform and the absolute value of the negative component of the second-order differential waveform to the other in a state in which the one of the positive component and the absolute value of the negative component is shifted along the time axis such that portions of the second-order differential waveform indicating the abnormal portion of the wire rope overlap with each other, based on the shift amount of the preliminary composite waveform with a largest maximum value based on each of the plurality of generated preliminary composite waveforms.

6. The wire rope inspection method as recited in claim 1, further comprising the step of:
prior to the step of acquiring the first-order differential waveform,
generating the magnetic flux waveform based on a difference between a reference detection signal as a reference and the acquired detection signal, the reference detection signal being acquired by detecting a change in a magnetic flux of the wire rope that is an inspection target in advance.

7. The wire rope inspection method as recited in claim 1, further comprising the step of:
prior to the step of acquiring the second-order differential waveform,
extracting either the positive component or the negative component of the first-order differential waveform based on a shape of the magnetic flux waveform.

8. The wire rope inspection method as recited in claim 1, further comprising the steps of:
prior to the step of acquiring the second-order differential waveform,
acquiring either the positive component or the negative component of the first-order differential waveform based on a comparison between a value based on the first-order differential waveform and a predetermined extraction determination threshold.

9. A wire rope inspection system comprising:
a wire rope inspector configured to detect a change in a magnetic flux of a wire rope that is an inspection target; and
a processor configured to perform processing for determining an abnormal portion of the wire rope based on a measurement result of the wire rope by the wire rope inspector,
wherein the wire rope inspector includes an exciter configured to apply a magnetic flux to the wire rope and a detector configured to acquire a direction signal by detecting the change in the magnetic flux of the wire rope to which a magnetic field has been applied, while relatively moving with respect to the wire rope,
wherein the processor includes:
a first differential processor configured to acquire a first-order differential waveform by performing first differential processing on a magnetic flux waveform that is a signal waveform based on the detection signal acquired by the detector;
a second differential processor configured to acquire a second-order differential waveform by performing second differential processing on a positive component or a negative component of the first-order differential waveform acquired by the first differential processor;
an addition processor configured to generate a composite waveform by adding a positive component of the second-order differential waveform acquired by the second differential processor and an absolute value of a negative component of the second-order differential waveform acquired by the second differential processor in a state in which at least one of portions of the acquired second-order differential waveform corresponding to the positive component and the absolute value of the negative component is shifted along a time axis such that the portions overlap with each other, the portions indicating an abnormal portion of the wire rope; and
a determination processor configured to determine the abnormal portion of the wire rope in a case where a value based on the composite waveform generated by the addition processor is greater than a predetermined determination threshold.

10. A wire rope inspection device comprising:
an exciter configured to apply a magnetic field to a wire rope that is an inspection target;

a detector configured to acquire a detection signal by detecting a change in a magnetic flux of the wire rope to which a magnetic field has been applied by the exciter, while relatively moving with respect to the wire rope; and a processor configured to perform processing for determining an abnormal portion of the wire rope based on the detection signal acquired by the detector, wherein the processor includes:

a first differential processor configured to acquire a first-order differential waveform by performing first differential processing on a magnetic flux waveform that is a signal waveform based on the detection signal acquired by the detector;

a second differential processor configured to acquire a second-order differential waveform by performing second differential processing on a positive component or a negative component of the first-order differential waveform acquired by the first differential processor;

an addition processor configured to generate a composite waveform by adding a positive component of the second-order differential waveform acquired by the second differential processor and an absolute value of a negative component of the second-order differential waveform acquired by the second differential processor in a state in which at least one of portions of the acquired second-order differential waveform corresponding to the positive component and the absolute value of the negative component is shifted along a time axis such that the portions overlap with each other, the portions indicating an abnormal portion of the wire rope; and a determination processor configured to determine the abnormal portion of the wire rope in a case where a value based on the composite waveform generated by the addition processor is greater than a predetermined determination threshold.

* * * * *